United States Patent
Takeuchi et al.

(10) Patent No.: US 8,989,242 B2
(45) Date of Patent: Mar. 24, 2015

(54) ENCODING/DECODING PROCESSOR AND WIRELESS COMMUNICATION APPARATUS

(75) Inventors: Toshiki Takeuchi, Tokyo (JP); Hiroyuki Igura, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 13/984,792

(22) PCT Filed: Feb. 7, 2012

(86) PCT No.: PCT/JP2012/052696
§ 371 (c)(1),
(2), (4) Date: Aug. 9, 2013

(87) PCT Pub. No.: WO2012/108411
PCT Pub. Date: Aug. 16, 2012

(65) Prior Publication Data
US 2013/0322501 A1    Dec. 5, 2013

(30) Foreign Application Priority Data
Feb. 10, 2011    (JP) .................. 2011-026885

(51) Int. Cl.
*H04B 1/38*    (2006.01)
*H04L 1/00*    (2006.01)
(Continued)

(52) U.S. Cl.
CPC ........... *H04L 1/0014* (2013.01); *H03M 13/091* (2013.01); *H03M 13/235* (2013.01); *H03M 13/2732* (2013.01); *H03M 13/6513* (2013.01); *H03M 13/6516* (2013.01);
(Continued)

(58) Field of Classification Search
CPC .............. H04L 2209/34; H04L 1/0014; H04L 12/5695; H04L 9/16; H04N 19/00018

USPC ........................................... 375/219; 711/100
See application file for complete search history.

(56) References Cited

U.S. PATENT DOCUMENTS

| | | | | |
|---|---|---|---|---|
| 5,455,862 A * | 10/1995 | Hoskinson | .................... | 380/262 |
| 6,327,690 B1 * | 12/2001 | Zhang et al. | .................. | 714/769 |
| 7,733,878 B2 * | 6/2010 | Knight et al. | .............. | 370/395.7 |
| 2001/0021971 A1 * | 9/2001 | Gibson et al. | .................. | 712/215 |
| 2009/0254718 A1 * | 10/2009 | Biscondi et al. | .............. | 711/154 |

FOREIGN PATENT DOCUMENTS

| | | | |
|---|---|---|---|
| JP | 09-018354 A | | 1/1997 |
| JP | 11-274942 A | | 10/1999 |

(Continued)

OTHER PUBLICATIONS

International Search Report for PCT Application No. PCT/JP2012/052696 mailed on Apr. 10, 2012.

*Primary Examiner* — Don N Vo
(74) *Attorney, Agent, or Firm* — Sughrue Mion, PLLC

(57) ABSTRACT

An encoding/decoding processor includes a coprocessor that is dedicated to encoding and decoding processes, where the coprocessor comprises: a parameter register that stores externally given operation modes and the settings of generation polynomials; and a calculation circuit that operates on the basis of the operation modes and the generation polynomials and that performs calculations, which are required for the encoding and decoding processes, by a plurality of bits per cycle in a parallel manner, and the coprocessor further comprises memory controllers, which include: address generator circuits for outputting the addresses of the storage devices; FIFO circuits for temporarily storing data; and data packing circuits for making up predetermined numbers of bits of data for output.

9 Claims, 24 Drawing Sheets

(51) Int. Cl.
  *H03M 13/09* (2006.01)
  *H03M 13/23* (2006.01)
  *H03M 13/27* (2006.01)
  *H03M 13/00* (2006.01)
  *H03M 13/29* (2006.01)
  *H03M 13/41* (2006.01)

(52) U.S. Cl.
  CPC ........ *H03M 13/6519* (2013.01); *H04L 1/0043* (2013.01); *H04L 1/0052* (2013.01); *H03M 13/2707* (2013.01); *H03M 13/29* (2013.01); *H03M 13/6561* (2013.01); *H04L 1/0071* (2013.01); *H03M 13/09* (2013.01); *H03M 13/2957* (2013.01); *H03M 13/41* (2013.01)
  USPC ........................................................ 375/219

(56) References Cited

FOREIGN PATENT DOCUMENTS

| | | |
|---|---|---|
| JP | 2000-148975 A | 5/2000 |
| JP | 2000-209102 A | 7/2000 |
| JP | 2000-295309 A | 10/2000 |
| JP | 2001-034573 A | 2/2001 |
| JP | 2002-541693 A | 12/2002 |
| JP | 2003-518280 A | 6/2003 |
| JP | 2005-516432 A | 6/2005 |
| JP | 2006-155637 A | 6/2006 |
| JP | 2007-295128 A | 11/2007 |
| JP | 2008-187722 A | 8/2008 |
| JP | 2009-505608 A | 2/2009 |
| JP | 2010-092499 A | 4/2010 |

\* cited by examiner

FIG. 5

| 31 30 29 28 27 26 25 24 23 22 21 | 20 19 18 17 16 |
|---|---|
| FIXED VALUE | 11 | cps / imm5 |

| 15 14 13 12 11 10 9 8 | 7 6 5 4 | 3 2 1 0 |
|---|---|---|
| op | FIXED VALUE | crs | crd | op
- 0: SCRAM
- 1: CONV
- 2: CRC
- 3: SHL
- 4: SHR
- 5: PERM
- 6: MSKC2C
- 7: MSKP2C
- 8: ......
- 9: ......

crd, crs
- 0: cr0
- 1: cr1
- 2: cr2
- 3: cr3
- 4: cr4
- 5: cr5
- 6: cr6
- ......
- E: cr14
- F: cr15 cps
- 0: cp0
- 1: cp1
- 2: cp2
- 3: cp3
- 4: cp4
- 5: cp5
- 6: cp6
- ......
- E: cp14
- F: cp15 imm5
- 0: 32
- 1: 1
- 2: 2
- ......
- A: 10
- B: 11
- C: 12
- ......
- 1E: 30
- 1F: 31

- 0: crd = SCRAM (crs, imm5)
- 1: crd = CONV (crs, imm5)
- 2: crd = CRC (crs, imm5)
- 3: crd = SHL (crs, imm5)
- 4: crd = SHR (crs, imm5)
- 5: crd = PERM (crs, cp)
- 6: crd = MSKC2C (crs, imm5)
- 7: crd = MSKP2C (cps, imm5)
- 8: ......
- 9: ......

op=OPERATION CODE (COMMAND TYPE)
crd=OUTPUT REGISTER(CR0–CR15)
crs=INPUT REGISTER(CR0–CR15)
cps=PARAMETER REGISTER(CP0–CP15)
imm5=IMMEDIATE VALUE(1–32)

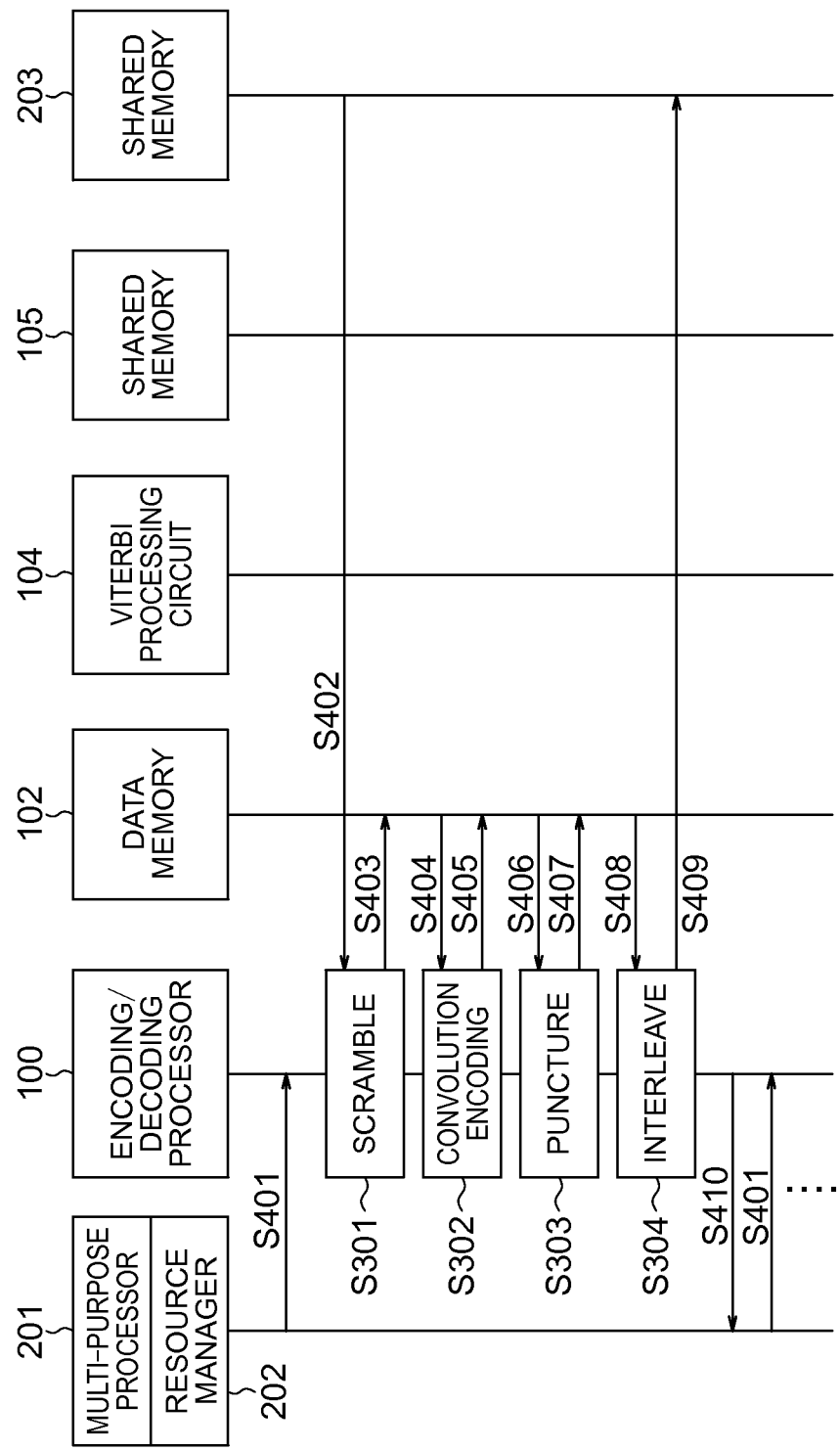

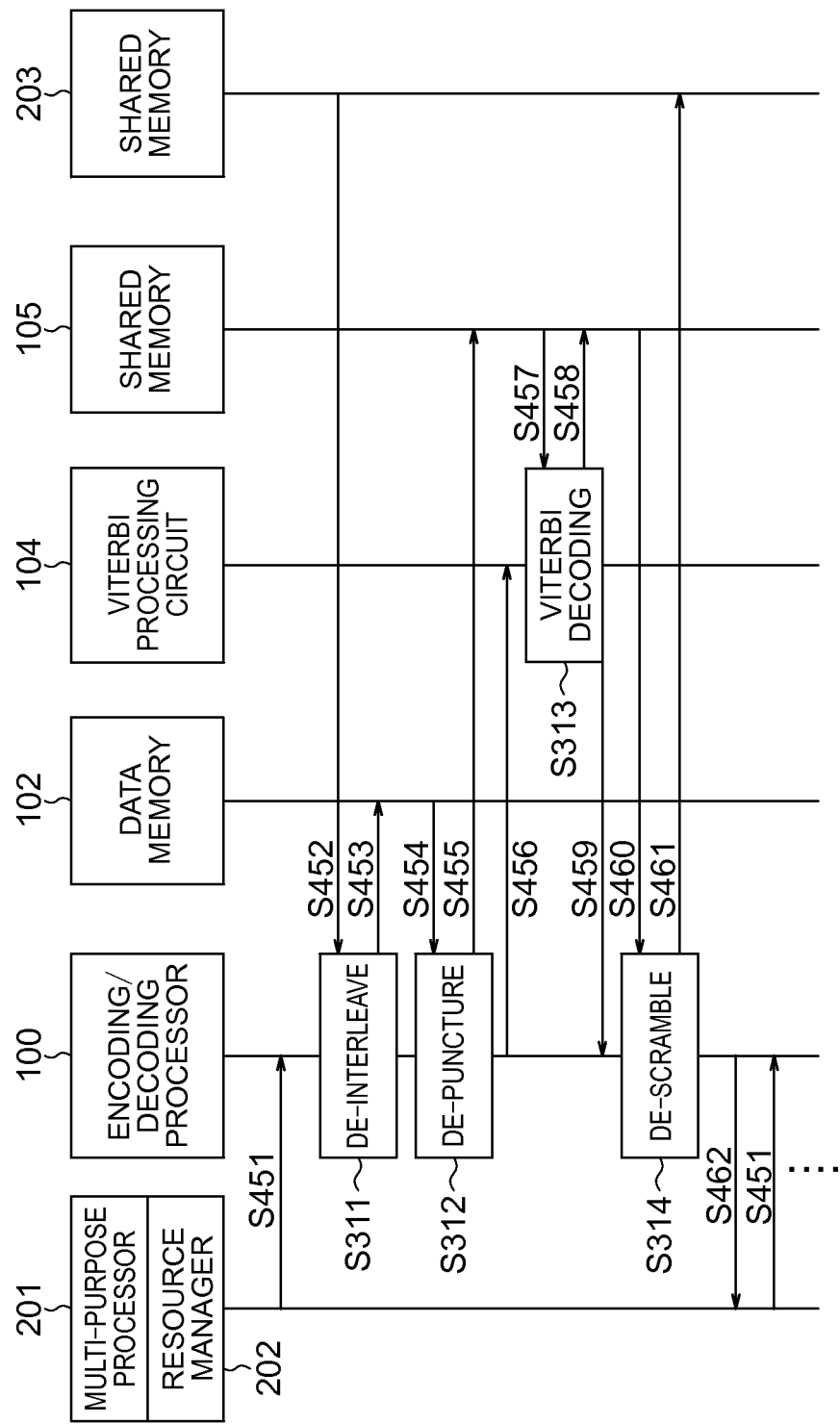

FIG. 19
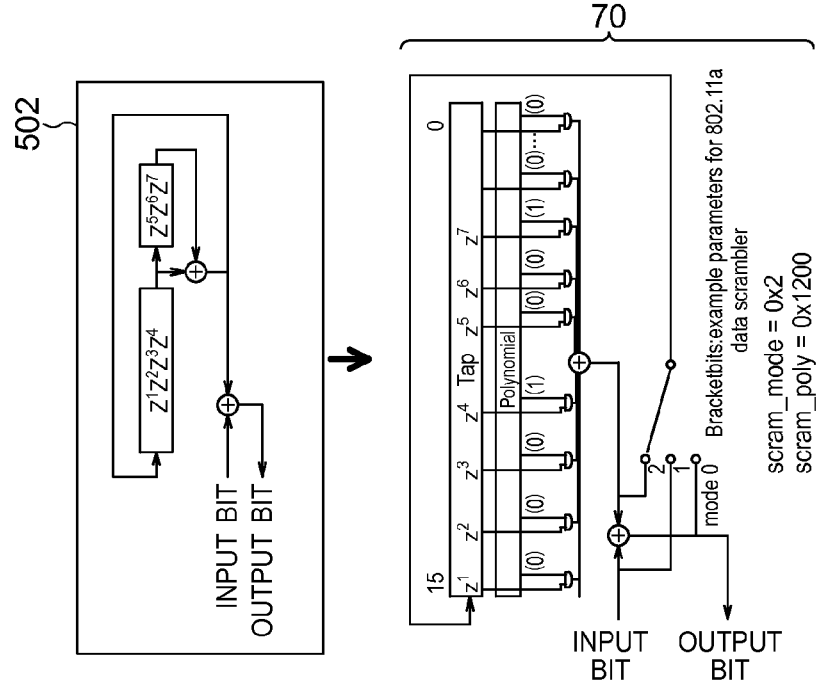
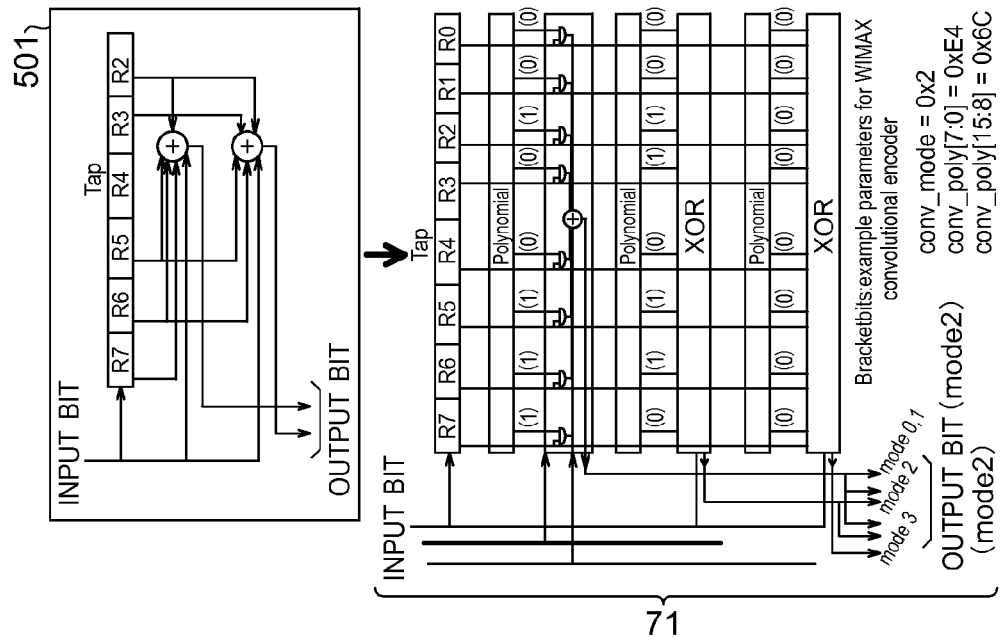

FIG. 20

```
void Scrambling_example (void)
{
        /* [1st] Scrambling (8bit * 4 * num1) */
        num1 = num_bit_size/32;                              } S401a
        set_smc_read (0x218000, num1, num1);
        set_lmc_write(0x118000, num1, num1);

r = 0x9400;
        p = 0x1200;
        st_prm(scram_mode, 0x0002);                          } S401b
        st_prm(scram_tap, r);
        st_prm(scram_poly, p);

st_smc(r_start, r_start);                            } S401c
        st_lmc(w_start, w_start);

for(i = 0; i < num1; i++){
          scram(cr2, cr3, 8);
          scram(cr2, cr3, 8);                                } S401d
          scram(cr2, cr3, 8);
          scram(cr2, cr3, 8);
        }
}
```

ENCODING/DECODING PROCESSOR AND WIRELESS COMMUNICATION APPARATUS

This application is a National Stage Entry of PCT/JP2012/052696 filed Feb. 7, 2012, which claims priority from Japanese Patent Application 2011-026885 filed Feb. 10, 2011, the contents of all of which are incorporated herein by reference, in their entirety.

TECHNICAL FIELD

The present invention relates to an encoding/decoding processor and a wireless communication apparatus. More specifically, the present invention relates to an encoding/decoding processor and the like capable of executing various kinds of encoding/decoding processing of a plurality of wireless systems at a high speed and with a simple circuit structure.

BACKGROUND ART

In a wireless communication system transmitting and receiving digital data, it is generally required to perform encoding/decoding processing of transmission/reception data signals. More specifically, on the transmission side, encoding processing such as adding CRC code to transmission data signals, scrambling processing, convolution encoding, and interleave (data rearrangement) processing is required. On the reception side, decoding processing such as de-interleave (inverse of interleave) processing on reception data signals, Viterbi decoding, de-scrambling processing, and CRC judgment processing is required.

In such encoding/decoding processing, calculations are performed with a bit unit or a byte unit. Thus, such processing may be referred to as bit/byte processing in some cases. Conventionally, such encoding/decoding processing has been achieved through mounting exclusive hardware circuits for each of the corresponding processing in order to deal with the encoding/decoding processing of a single wireless communication system at a high speed and with low power consumption.

Further, recently, there is an increasing expectation on a software wireless technique which makes it possible to deal with a plurality of wireless systems with a single device. Among the various kinds of normalized or standardized wireless systems, the contents of the encoding/decoding processing are similar to each other. However, the processing data unit, a part of processing parameters in calculations, the calculation order, and the like thereof are different.

However, to deal with the encoding/decoding processing of the plurality of wireless systems with the method of mounting the exclusive hardware circuit for each of the wireless communication systems, the corresponding numbers of exclusive hardware circuits are required for the number of the wireless systems to be dealt with. This causes an issue that the area of the circuits to be required and the cost thereof are increased. Further, it is also an issue that the flexibility for changes and expansions of the processing is low.

As a technique that can overcome such issue, depicted in Patent Document 10 to be described later is a technique which makes it possible to achieve both the high-speed characteristic and the power efficiency by dealing with a plurality of wireless systems through making the exclusive hardware circuit as the structure that can be set by various parameters. This is designed to deal with a plurality of wireless systems flexibly by constituting an exclusive processing engine to be resettable so as to be able to deal with a plurality of kinds of base band processing.

Further, as a technique similar to that, Patent Document 1 discloses a technique with which the exclusive hardware circuit is structured to be capable of setting operation modes and it is controlled from a central overall control processor to flexibly deal with system changes and the like.

Further, Patent Document 7 discloses a technique which performs processing on the encoding/decoding processing corresponding to a plurality of wireless systems with software by using a processor such as an exclusive signal processor (DSP) or the like. This is a technique which flexibly corresponds to various kinds of communication systems by achieving communication processing through using a typical signal processor and a DMA controller for increasing the speed of access to the memory in order to secure the flexibility.

Further, as a technique similar to that, Patent Document 2 discloses a technique which reduces memory access latency of a processor through providing an exclusive memory controller on the outside of a signal processing processor.

As other related techniques, Patent Document 3 discloses an image-processing signal processor capable of having a built-in magnification variable function while suppressing increase in the circuit scale by using a single memory port. Patent Document 4 discloses a logic integrated circuit capable of saving the space of the operation logic through structuring it to be capable of executing adding processing and multiplication processing in parallel.

Furthermore, Patent Document 5 discloses a communication system which sets a parameter regarding communications by a forward pilot tone and a reverse pilot tone. Patent Document 6 discloses a multiprocessor system which improves the efficiency of data transfer among a plurality of processors through compressing data locally before transferring it to a shared memory.

Patent Document 8 discloses a processor design tool and the like including an address generating unit which calculates an address every time according to a command. Patent Document 9 discloses a communication system that uses a processor that includes a register file used for calculation provided inside thereof.

Patent Document 1: Japanese Unexamined Patent Publication 2000-295309
Patent Document 2: Japanese Unexamined Patent Publication 2001-034573
Patent Document 3: Japanese Unexamined Patent Publication 2006-155637
Patent Document 4: Japanese Unexamined Patent Publication 2007-295128
Patent Document 5: Japanese Unexamined Patent Publication 2008-187722
Patent Document 6: Japanese Unexamined Patent Publication 2010-092499
Patent Document 7: Japanese Patent Application Publication 2002-541693
Patent Document 8: Japanese Patent Application Publication 2003-518280
Patent Document 9: Japanese Patent Application Publication 2005-516432
Patent Document 10: Japanese Patent Application Publication 2009-505608

The first issue is that it is not possible to flexibly deal with various kinds of encoding/decoding processing of a plurality of wireless communication systems in the encoding/decoding processing (bit/byte calculation processing) of a wireless communication apparatus.

The reason is as follows. Regarding the content of encoding/decoding processing in general, each processing among the plurality of wireless communication systems is similar in many cases. However, a part of processing parameters and calculation orders largely depend on the specifications of each of the wireless systems and the required calculation amount is relatively large. Therefore, conventionally, exclusive hardware circuits are mounted for each of the wireless systems.

However, in accordance with improvements in the processing capacity achieved due to the increases in the scale, the speed, and the like of recent system LSI, it is desired to achieve a wireless communication apparatus called a multimode wireless device or a software wireless device (SDR: Software Defined Ratio) capable of dealing with a plurality of wireless systems with a same encoding/decoding processing circuit. Further, it is also required to be the type capable of flexibly dealing with future specification changes and functional expansions.

The second issue is as follows. In a case where encoding/decoding processing (bit/byte calculation processing) is achieved by software processing by using a processor while placing a great importance on the flexibility in a wireless communication system, it is not possible to perform processing such as simultaneous calculations of a plurality of bits (bytes) at a high speed including memory access latency.

The reason is as follows. In order to process a single bit with the encoding/decoding processing in the wireless communication, information of a plurality of bits before and after that bit is required. Thus, it is not particularly an issue when executing the processing thereof in parallel with exclusive hardware circuits. However, in a case where it is to be achieved by software processing by using a processor while placing the importance on the flexibility and the expandability, it is difficult with a typical processor to simultaneously perform calculations of the encoding/decoding processing of a plurality of bits/bytes.

Further, in the case of the software processing by using the processor, the processor generally accesses to the memory, so that specific latency (the cycle number or delay time) is required. Therefore, the operability of the calculator is decreased for that and the processing time is increased, so that the processing cannot be performed at a high speed.

Note here that the processing amount of the encoding/decoding processing in the wireless communication generally depends on the required data transfer rate. The required data transfer rate is increased in the recent wireless systems, and the still lower power consumption is desired. Therefore, it is important to be able to perform high-speed communication with the still lower power consumption.

The technique capable of overcoming the issues described above is not depicted in each of the above-described Patent Documents. While it is possible with the technique depicted in Patent Document 10 to deal with changes in a part of the processing parameters of a calculation formula relatively easily by executing resetting, it is not possible to easily deal with changes in the processing data unit, the repeating number, the detailed calculation order, the processing order among each of the processing engines (exclusive hardware circuits), and the like.

In order to constitute it to be able to change the processing order and the like as well, the connection structure between each of the exclusive hardware circuits becomes extremely complicated so that the area of the device and the required cost are increased further. Also, it is still not possible to flexibly deal with future expected expansion of specifications such as changes in the calculation order and the like within processing engines.

Further, it is not possible with the technique depicted in Patent Document 1 to easily deal with changes in the detailed processing order, and the processing order and the like between each of the processing (exclusive hardware circuits) because of the same reasons.

In the meantime, with the technique depicted in Patent Document 7, the encoding/decoding processing of the wireless communication becomes special bit processing with the bit unit or the byte unit. Thus, the number of processing cycles is increased greatly with a typical signal processor compared to the case of the exclusive hardware structure that is capable of executing calculations of a plurality of bits in parallel. Further, while the flexibility for the changes in the processing is extremely high, the access latency from the processor to the memory, for example, comes to be in a state of performance overhead. Therefore, it is also difficult to increase the speed.

Even if a DMA controller is used for making an access to the memory, different cycles are required for a memory load/storing command and a calculation processing command in the case of the software processing executed by using the processor. Thus, the speed becomes slower compared to the case of the exclusive hardware processing, and the performance overhead of the bit shift processing and the like is required when the data unit to be processed by the processing and the data unit to be stored on the memory are different. For increasing the speed further in such case, it is necessary to increase the speed of the clock frequency. This results in increasing the power consumption and the heating value.

Further, with the technique depicted in Patent Document 2, the throughput at the time of data writing where the address and the data are transferred together while simply incrementing the address for an external memory is improved. However, the transfer cycles of the data corresponding to the addresses are different (2 cycles or more are required for reading out), so that the throughput at the time of reading out the data cannot be improved. Further, the addresses are for performing simple increment, so that it is not possible to deal with the special address order that is not the simple increment such as interleave/de-interleave processing in the coding/decoding processing of the wireless communication.

None of the other techniques depicted in Patent Documents 3 to 6 and Patent Documents 8 to 9 is designed to achieve encoding/decoding processing that can deal with a plurality of wireless communication systems at a high speed and with a simple circuit structure. Further, none of those is provided with the structure for that, so that such issues cannot be overcome naturally.

The object of the present invention is to provide the encoding/decoding processor and the wireless communication apparatus capable of achieving various kinds of encoding/decoding processing in a plurality of wireless communication systems at a high speed and with a simple circuit structure.

DISCLOSURE OF THE INVENTION

In order to achieve the foregoing object, the encoding/decoding processor according to the present invention is an encoding/decoding processor built-in within a wireless communication apparatus for performing encoding and decoding processing of communication data, which is characterized to include a coprocessor used exclusively for the encoding and decoding processing, wherein the coprocessor includes: a parameter register which stores setting regarding an operation mode and a generation polynomial given from outside; and a calculation circuit which is operated based on the operation mode and the generation polynomial, and performs a calculation required for the encoding and decoding processing of a plurality of bits in parallel in 1 cycle.

In order to achieve the foregoing object, the wireless communication apparatus according to the present invention is characterized to include an encoding/decoding (codec) module which performs encoding processing on transmission data transmitted to outside and decoding processing on reception data received from outside, wherein the encoding/decoding (codec) module includes: an error correction decoding processing circuit that is exclusive hardware for performing error correction decoding of the reception data; and the encoding/decoding processor as depicted in any one of claims 1 to 8 for performing processing other than the error correction decoding of the reception data. Note here that the error correction decoding herein means one or more kinds of processing out of Viterbi decoding and turbo decoding.

As described above, the present invention is so structured that the coprocessor used exclusively for encoding and decoding processing includes the programmable calculation device which performs calculations of a plurality of bits in parallel in 1 cycle based on an operation mode and a generation polynomial given from outside. Thus, encoding/decoding processing can be performed at a high speed, and the processing content thereof can be easily changed from the outside. This makes it possible to provide the wireless communication apparatus and the coding/encoding processor capable of achieving various kinds of encoding/decoding processing in a plurality of wireless communication systems at a high speed and with a simple circuit structure.

BRIEF DESCRIPTION OF THE DRAWINGS

FIG. 5 is an explanatory chart showing an example of a structure of a command code of a coprocessor command in the coprocessor shown in FIG. 2;

FIG. 17 is a sequence chart showing more details of the example of the processing sequence of the encoding processing shown in steps S301 to 304 when the processing shown in FIG. 16A is performed by the encoding/decoding processor shown in FIG. 1 and FIG. 3;

FIG. 18 is a sequence chart showing more details of the example of the processing sequence of the decoding processing shown in steps S311 to 314 when the processing shown in FIG. 16B is performed by the encoding/decoding processor shown in FIG. 1 and FIG. 3;

FIG. 19 is an example of a mapping structure of a case where convolution encoding processing and scrambling (descrambling) processing of the encoding/decoding processor shown in FIG. 1 and FIG. 3 are processed by mapping it to an exclusive calculation unit (ALU) within the coprocessor, i.e., an explanatory chart showing a setting example of a parameter register;

FIG. 20 is an explanatory chart showing a descriptive example of a processor processing program of a case where convolution encoding processing and scrambling (de-scrambling) processing of the encoding/decoding processor shown in FIG. 1 and FIG. 3 are performed;

Figure 1:
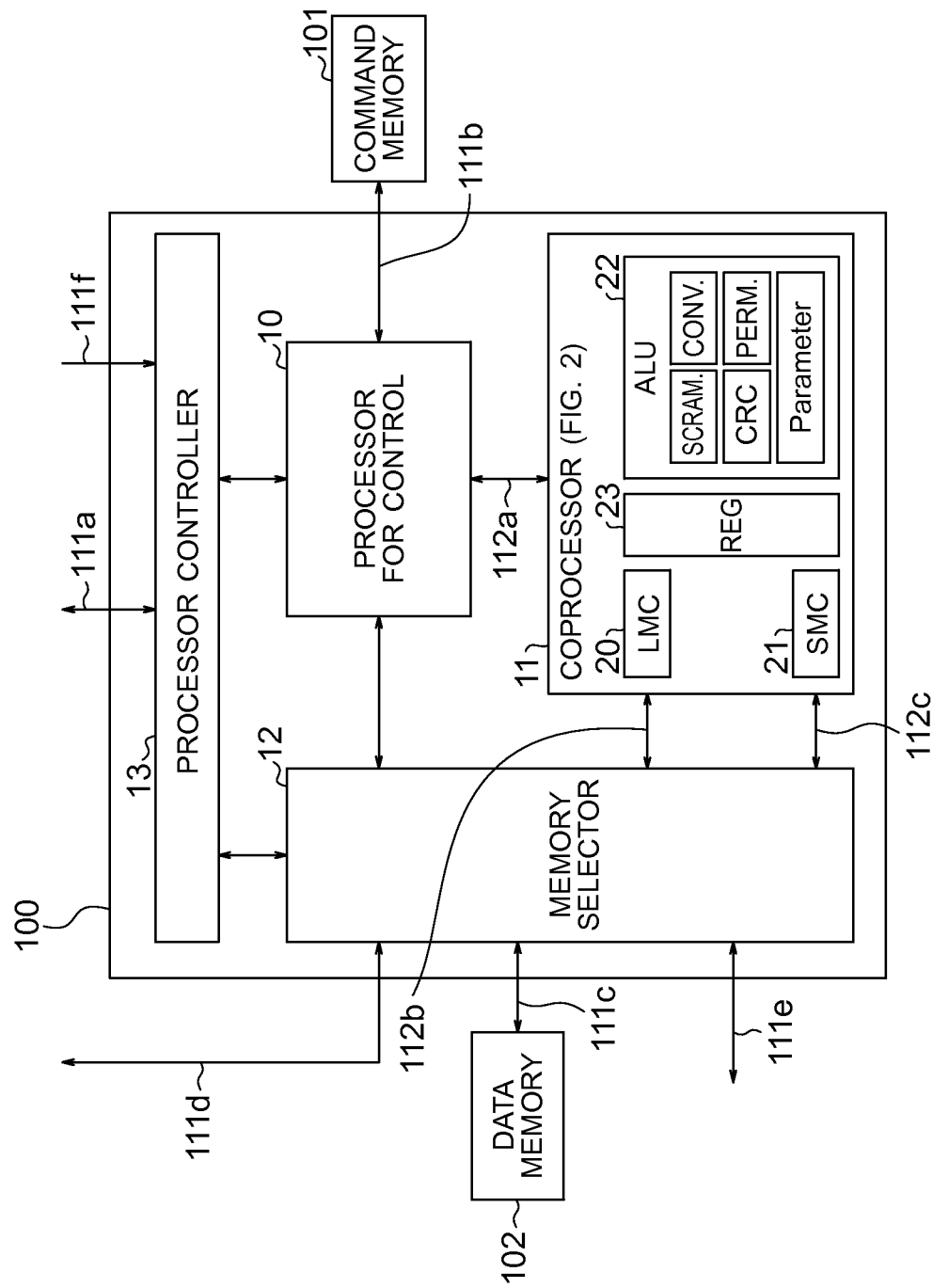
FIG. 1 is an explanatory chart showing a more detailed structure of an encoding/decoding processor shown in FIG. 3.

BEST MODES FOR CARRYING OUT THE INVENTION (First Exemplary Embodiment)

Hereinafter, the structure of a first exemplary embodiment of the present invention will be described by referring to the accompanying drawings FIGS. 1 to 3, 10, and 12 to 13.

The basic content of the exemplary embodiment will be described first, and a more specific content will be described thereafter.

An encoding/decoding processor 100 according to the exemplary embodiment is an encoding/decoding processor that is built-in within a wireless communication apparatus 1 for performing encoding and decoding processing of communication data. The encoding/decoding processor 100 includes a coprocessor 11 used exclusively for encoding and decoding processing. Further, the coprocessor 11 includes: a parameter register 60 which stores settings regarding an operation mode and a generation polynomial given from outside and a calculation circuit 22a which operates based on the operation mode and the generation polynomial and performs calculations required for encoding and decoding processing for a plurality of bits in parallel with one cycle.

Further, the coprocessor 11 includes memory controllers 20 to 21 for making an access to a storage device that is built in or connected outside. The memory controllers 20 to 21 include: address generator circuits 30, 40 which execute operations for outputting addresses on the storage device for independently reading/writing data by a parameter given from outside; FIFO (First In First Out) circuits 31, 41 which temporarily store data written to the outputted address on the storage device or data read from the address; and data packing circuits 32, 42 which output the data written to the outputted address on the storage device or the data read from the address by aligning the number of bits thereof to a predetermined number of bits. Each of those circuits is provided for reading out the data (40, 41, 42) and for writing the data (30, 31, 32), respectively.

Further, the data writing address generator circuit 30 includes: a control register 30a1 which stores an initial pointer, step number, and memory length, respectively; and an address calculator 30a2 which outputs, as a next address pointer, a result acquired by performing a remainder calculation ("modulus calculation" or "residue calculation") on the value of the step number acquired by adding the values of the step number every time an address is issued by taking the initial pointer value as the initial value with the value of the memory length.

Further, the data readout address generator circuit 40 includes: a plurality of offset address calculation modules 80; and an adder 40a4 which adds the issued addresses from the offset address calculation modules to acquire an actual offset address. The offset address calculation module 80 includes a first and a second address calculators 81 to 82, and an address pointer 81a of the first address calculator 81 is updated to the value of an address pointer 82a calculated in the second address calculator 82 with a value of the count number given from outside for every specific number of times.

Further, the data readout address generator circuit 40 also includes: a shift circuit 40a2 which shifts the issued offset address by a memory address unit according to an address unit setting given from the outside; and a bit shift data FIFO circuit 40a3 which acquires a prescribed bit position from the data read out from the memory.

Further, the memory controllers 20 to 21 include: regular access functions (CR2 to 3) which read out data stored at a designated register access number on the storage device from the programmable calculator side and update the stored content at the registered access number; and peep functions (CR4 to 5) which read out the data stored at the designated register access number on the storage device from the programmable calculator side without update.

In the meantime, the calculation circuit 22a includes a function which performs processing of one or more kinds out of scrambling processing 50, convolution encoding processing 51, CRC encoding processing 52, and bit connection/rearrange processing 53 according to the operation mode and the generation polynomial give from the outside.

The wireless communication apparatus 1 having the built-in encoding/decoding processor 100 includes an encoding/decoding (codec) module 200 which performs encoding processing of transmission data to be transmitted to the outside and decoding processing of reception data received from the outside. The encoding/decoding (codec) module 200 includes: error correction decoding processing circuits (a Viterbi processing circuit 104a and a turbo processing circuit 104b) as exclusive hardware for performing error correction decoding of the reception data; and the above-described encoding/decoding processor 100 which performs processing other than the error correction decoding of the reception data.

Through providing such structures, the encoding/decoding processor 100 can achieve the various kinds of encoding/decoding processing of a plurality of wireless communication systems at a high speed and with a simple circuit structure.

This will be described in more details hereinafter.

Figure 3:
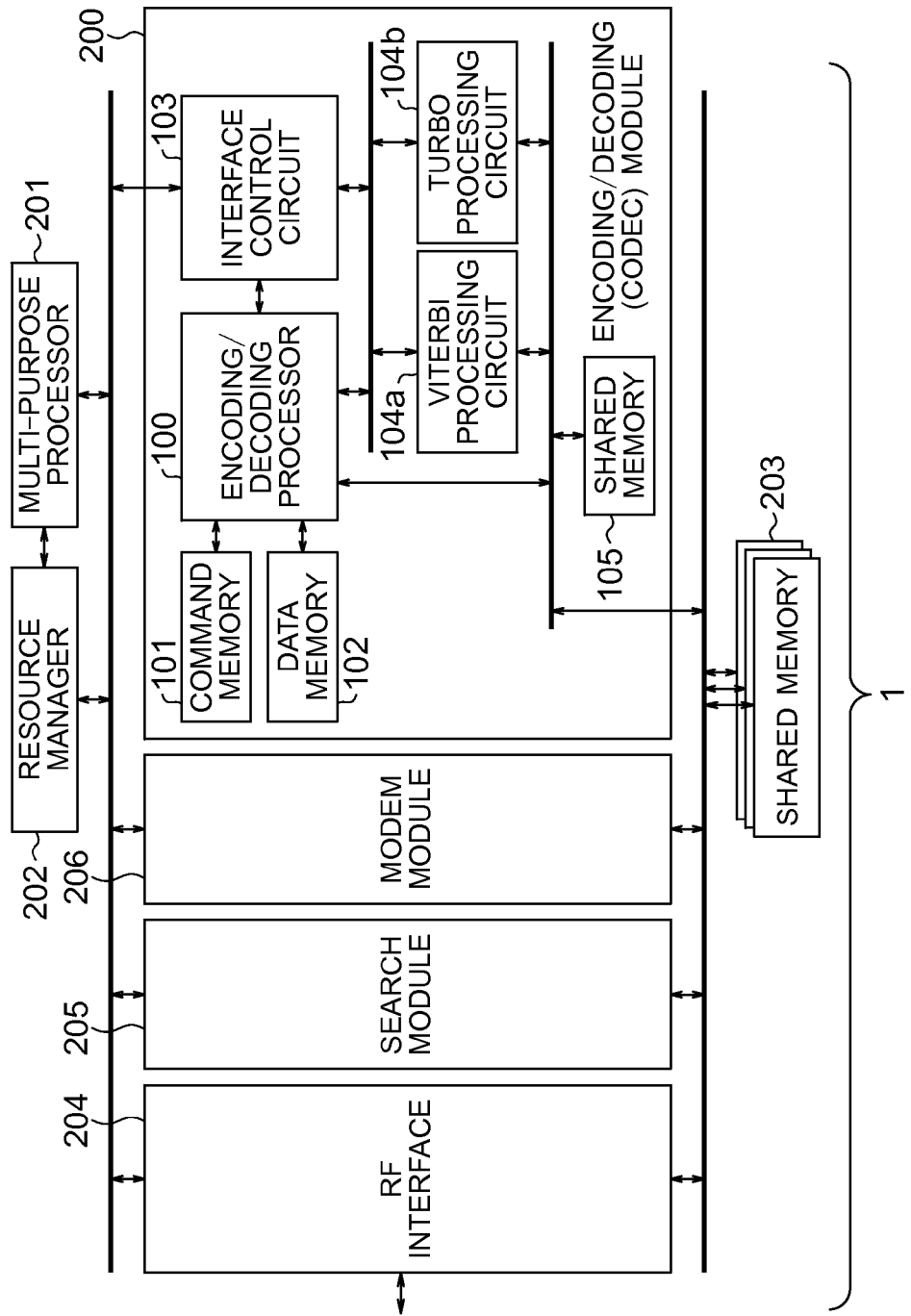
FIG. 3 is an explanatory chart showing the structure of a wireless communication apparatus which uses the encoding/decoding processor according to a first exemplary embodiment of the present invention.

FIG. 3 is an explanatory chart showing the structure of the wireless communication apparatus 1 using the encoding/decoding processor 100 according to the first exemplary embodiment of the present invention. The wireless communication apparatus 1 is constituted by employing the encoding/decoding processor 100 in the encoding/decoding (codec) module 200 that is capable of dealing with a plurality of wireless communication system including wireless LAN (IEEE802.11a) system, WiMAX (IEEE802.16e) system, and the like standardized by IEEE (Institute of Electrical and Electronic Engineers).

As the modules for performing baseband processing of the wireless communication, the wireless communication apparatus 1 includes: a search module 205 which establishes synchronization between a base station and terminals and searches timing; a modem module 206 which performs modulation processing of transmission data and demodulation processing of reception data; the encoding/decoding (codec) module 200 which performs encoding processing of the transmission data and decoding processing of the reception data; a multi-purpose processor (CPU) 201 which processes communication data regarding higher-order layers (layer 2 or layer 3); a resource manager 202 which performs execution control between each of the wireless communication modules; and a shared memory 203 for transferring data between each of the wireless communication modules.

The encoding/decoding processing (codec) module 200 includes: the encoding/decoding processor 100; a command memory 101; a data memory 102; an interface control circuit 103; the Viterbi processing circuit 104a; the turbo processing circuit 104b; and a shared memory 105 which shares data between the encoding/decoding processor 100 and the Viterbi processing circuit 104.

That is, among the encoding/decoding processing, the error correction decoding processing whose processing amount is so large that the processing capacity is insufficient with the processor processing is processed by using the Viterbi processing circuit 104a and the turbo processing circuit 104b as the exclusive hardware, and the other plurality of kinds of encoding/decoding processing are processed by using the encoding/decoding processor 100. The error correction encoding herein means one or more kinds of processing out of Viterbi decoding and turbo decoding.

FIG. 1 is an explanatory chart showing a more detailed structure of the encoding/decoding processor 100 shown in FIG. 3. The encoding/decoding processor 100 is structured by connecting a coprocessor exclusively used for encoding/decoding processing (bit/byte calculation processing) to a control processor 10.

As the interfaces, the encoding/decoding processor 100 according to the present invention includes: a processor control interface 111a for performing a boot control and an interruption signal input from the outside; a command memory interface 111b for making an access to the command memory 101 from the encoding/decoding processor 100; a local memory interface 111b for making an access to a local memory (data memory) 102; a shared memory interface 111c for making an access to the shared memory 105 or 203; a DSP interface 111d for making a control-access to an external device; a shared memory interface 111e for making a stream-access to an external shared memory; and the like.

The inside of the encoding/decoding processor 100 is structured by connecting the exclusively-used encoding/decoding processing coprocessor 11 as the feature of the exemplary embodiment to the typical control processor 10 (e.g., Harvard architecture type 32-bit RISC processor) provided with a coprocessor interface 112a via the coprocessor interface 112a.

The coprocessor 11 includes a local memory interface 112b and a shared memory interface 112c, and it is capable of making a stream-access (burst access that supports split transaction) to each of the local memory (data memory 102) or the shared memory 105 via each of the interfaces.

Note here that the memory selector (MUX type bus controller) 12 is used for performing mediation/selection controls of a data access from the control processor 10 and a local memory access from the coprocessor 11, and the local memory (data memory 102) is connected to the local memory interface 111c from the memory selector 12. Further, the command memory 101 is directly connected to the command memory interface 111b of the control processor 10.

Note that a processor controller 13 is a block for performing a boot control, an interruption control, and the like from the outside. Regarding access to the local memory (data memory 102) and the command memory 101 from the outside, it is possible to employ a structure (bypass) capable of making an access directly to each memory from the outside or a structure for making an access via the processor control interface 111a.

Figure 2:
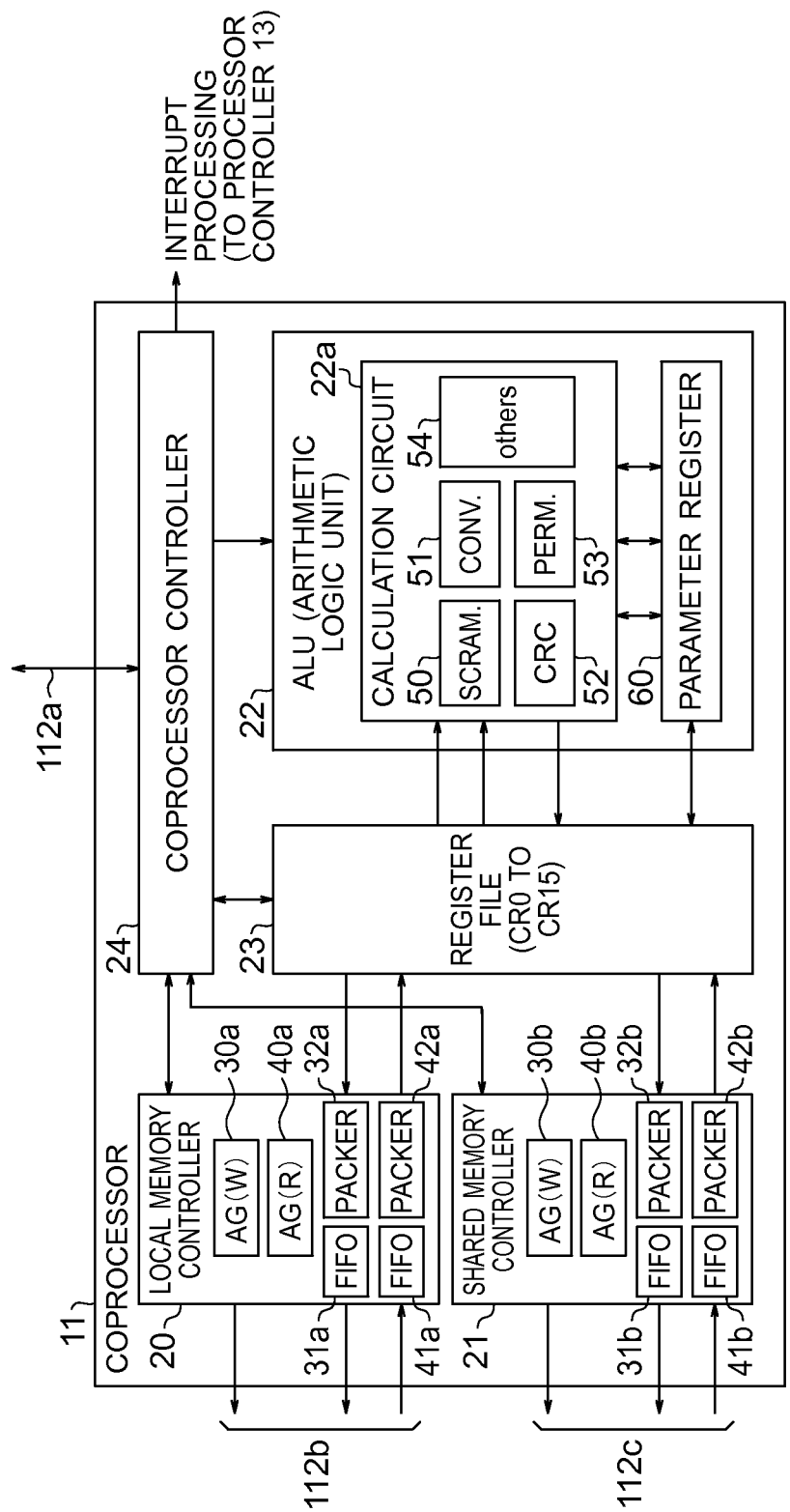
FIG. 2 is an explanatory chart showing a more detailed structure of a coprocessor shown in FIG. 1.

FIG. 2 is an explanatory chart showing a more detailed structure of the coprocessor 11 shown in FIG. 1. In order to hide the latency at the time of making a memory access, the coprocessor 11 includes: a local memory controller (LMC) 20 capable of making a stream-access to the local memory (data memory 102) via the local memory interface 112b; and a shared memory controller (SMC) 21 capable of making a stream-access to the external shared memory via the shared memory interface 112c.

In order to access to the local memory (data memory 102) and the external shared memory of the outside in parallel to the calculation processing within the processor and the coprocessor, the local memory controller (LMC) 20 and the shared memory controller (SMC) 21 include, inside each thereof: a writing address generator 30; a writing data FIFO circuit (First In First Out) 31; a writing data packing circuit 32; a readout address generator 40; a readout data FIFO circuit 41; and a readout data packing circuit 42.

Hereinafter, those provided inside the local memory controller 20 are referred to as a writing address generator (AG (W)) 30a, a writing data FIFO circuit 31a, a writing data packing circuit (PACKER) 32a, a readout address generator (AG (R)) 40a, a readout data FIFO circuit 41a, and a readout data packing circuit (PACKER) 42a, respectively. Further, those provided inside the shared memory controller (SMC) 21 are referred to as a writing address generator 30b, a writing data FIFO circuit 31b, a writing data packing circuit 32b, a readout address generator 40b, a readout data FIFO circuit 41b, and a readout data packing circuit 42b, respectively.

Further, the local memory controller 20 and the shared memory controller 21 also include a split transaction function which speculatively issues an address at the time of reading. While the case of mounting one each of the local memory controller 20 and the shared memory controller 21 is presented in FIG. 1 or FIG. 2, the number of those is not specifically an issue with the exemplary embodiment.

Further, the coprocessor 11 includes an ALU (Arithmetic Logic Unit) 22 (referred simply as the unit 22 hereinafter) exclusively used for encoding/decoding processing (bit/byte calculation processing). The unit 22 includes the scrambling circuit (SCRAM) 50, the convolution encoder (CONV) 51, the CRC encoder (CRC) 52, the bit connection/rearrange circuit (PERM) 53 and the calculation circuit 22a that can operate as other units 54 (others), which are generally used in encoding/decoding processing of a plurality of wireless communication systems. The structures thereof will be described later.

Further, regarding the calculation circuit 22a, parameters related to the operation mode thereof are set by the parameter register 60 provided inside the coprocessor 11. This makes it possible to provide a programmable structure capable of flexibly dealing with each kind of the encoding/decoding processing in various wireless systems.

Note here that the scrambling circuit (SCRAM) 50 is used for scrambling/de-scrambling processing of the encoding/decoding processing, the convolution encoder (CONV) 51 is used for convolution encoding processing, the CRC encoder (CRC) 52 is used for CRC encoding processing and CRC judgment processing, the bit connection/rearrange circuit (PERM) 53 is used for bit repetition processing, puncture/de-puncture processing, easy bit interleave/bit de-interleave processing, and the like, respectively.

Further, the coprocessor 11 according to the present invention includes a coprocessor register file (REG) 23 that can be used for a coprocessor command. This is a different register from the one that is originally provided inside the control processor 10. As multi-purpose registers within the register file (REG) 23, sixteen 32-bit registers (CR0 to CR15), for example, are provided.

However, two multi-purpose registers (CR2, CR3) among those, for example, are operated as special registers. For example, one (e.g., CR2) is allotted for receiving data from the local memory controller 20, and the other (e.g., CR3) is allotted for receiving data from the shared memory controller 21. The operations thereof will be described in details later.

With this structure, the multi-purpose registers as the special registers can be used for making accesses to the local memory (data memory 102) and the external shared memory. That is, it is possible to process the stream data accesses to the local memory (data memory 102) and the external shared memory with the same command mapping and processing cycle number as those of the multi-purpose register within the coprocessor 11.

Further, the coprocessor 11 also includes a coprocessor controller 24. The coprocessor controller 24 performs decoding processing of a coprocessor command, and performs controls of the unit 22, the register file 23, the local memory controller 20, and the shared memory controller 21. Further, the coprocessor controller 24 performs interruption processing for the controller processor 10 via the processor controller 13.

(Basic Operations of Synchronization Processing According to Exemplary Embodiment)

The encoding/decoding processor 100 according to the exemplary embodiment shown in FIG. 1 executes the processor processing while reading out a command code from the command memory 101 and making an access to the data memory (local memory) 102, when the control processor 10 is started from the outside by using the processor control interface 111a and the interruption interface 111f. Further, as necessary, the encoding/decoding processor 100 makes an access to the shared memory 105 and the external peripheral apparatuses via the memory selector 12.

For executing the processing by using the encoding/decoding coprocessor 11 that is the feature of the present invention, a coprocessor command of the control coprocessor is used as a command code. When the control processor 10 reads out a coprocessor command from the command memory 101, the control processor 10 makes the coprocessor 11 execute the coprocessor processing via the coprocessor interface 112a.

The coprocessor 11 side shown in FIG. 2 decodes the coprocessor command received via the coprocessor interface 112a by using the coprocessor controller 24, and executes the decoded coprocessor command by controlling the unit 22, the register file 23, the local memory controller 20, and the shared memory controller 21.

(Explanations Regarding Structures and Operations of Multi-Purpose Registers within Coprocessor)

Figure 4A:
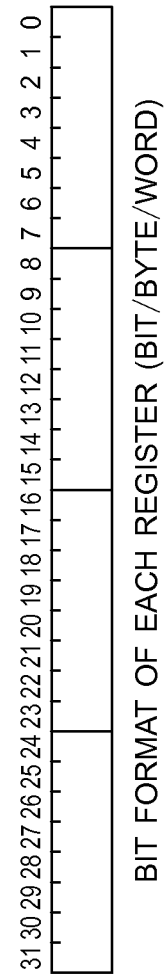
FIG. 4A is an explanatory chart showing an example of a mapping structure of a register file of the coprocessor shown in FIG. 2.
Figure 4B:
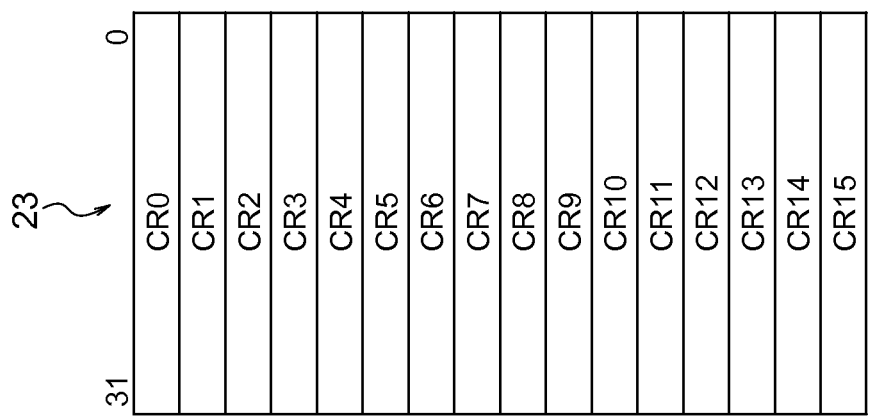
FIG. 4B is an explanatory chart showing a bit format of each register of the coprocessor shown in FIG. 2.

FIG. 4A is an explanatory chart showing an example of the mapping structure of the register file (REG) 23 of the coprocessor 11 shown in FIG. 2. FIG. 4B is an explanatory chart showing the bit format of each register of the coprocessor 11 shown in FIG. 2. The coprocessor 11 includes sixteen 32-bit registers (CR0 to CR15), for example, as the multi-purpose registers within the register file (REG) 23, and executes a calculation command within the coprocessor, a calculation command between the control processor and the coprocessor, etc. by using these registers.

Some of the registers among those operate as the exclusive registers. For example, one register (CR0) operates as a zero register (writing access is invalid, and the value of readout access is always "0"). Further, two multi-purpose registers (CR2, CR3) among sixteen registers are operated as special registers used for making a memory access. For example, one (e.g., CR2) is allotted to be used for making an access to the local memory, and the other one (e.g., CR3) is allotted to be used for making an access to the external shared memory.

That is, in this case, when the unit 22 makes a writing access to the CR2 register, the data is written to the local memory (data memory 102) via the writing data packing circuit 32 and the writing data FIFO circuit 31 within the local memory controller (LMC) 20. The writing address of this time is an address designated by the writing address generator 30 within the local memory controller (LMC) 20.

At this time, as the operations of the unit 22 and the coprocessor controller 24, there is only the writing to the CR2 register. Thus, it is possible to execute a next coprocessor command. As a result, processing result data can be written to the local memory (data memory 102) with 1 [data/cycle] writing throughput.

In the meantime, the readout address generator 40 and the like within the local memory controller (LMC) 20 are operated in advance to start to read out the stream data on the local memory (data memory 102). This enables the exclusive unit (ALU) 22 to read out the data on the local memory (data memory 102) via the readout data FIFO circuit 41 and the readout data packing circuit 42 within the local memory controller (LMC) 20 by simply making a readout access to the CR2 register.

In this case, the data on the local memory (data memory 102) is also read out and transferred to the inside the local memory controller (LMC) 20 in advance. Thus, as the operations of the unit 22 and the coprocessor controller 24, it is possible to make a readout access to the CR2 register without waiting time. As a result, processing data can be read out from the local memory (data memory 102) with 1 [data/cycle] reading throughput.

Similarly, through performing a writing access and a readout access to/from the CR3 register, it is possible to make an access to the external shared memory via the shared memory controller (SMC) 21 while hiding the memory access latency.

Further, FIG. 4A shows an example where the other two registers (CR4 to 5) are operated as peep (PEEP) processing registers by the parameter register setting.

As described above, the CR2 register and the CR3 register are registers for making accesses to each of the local memory (data memory 102) and the shared memory. When a readout access is made to those CR2 register and CR3 register, the states of the readout data FIFO circuit 41 and the readout data packing circuit 42 are updated.

Similarly, when the CR4 register and the CR5 register are operated as the peep processing registers and a readout access is made thereto, the CR4 register (LMP) can read out the same data as that of the CR2 register (LM), and the CR5 register (SMP) can read out the same data as that of CR3 register (SM). Further, the states of the readout data FIFO circuit 41 and the readout data packing circuit 42 are not updated.

That is, the data read out from the CR4 register can be read out again from the CR2 register thereafter. Further, the data read out from the CR5 register can be read out again from the CR3 register thereafter. Therefore, the peep register function is effective in a case where the same data is used for a plurality of times. Note that it is also possible to select whether the CR4 register and the CR5 register are to be used as the peep function registers or the regular multi-purpose registers by the parameter setting.

The bit format of each register in the example shown in FIG. 4A and FIG. 4B is of 32 bit, and it is used for 1 bit×32 data or for 1 byte (8 bit)×4 data, for example. In the exemplary embodiment, it is defined to use the bit format of "LSB first" and little endian, and the data is processed in order from the LSB (Least Significant Bit, lowermost bit) side in a case of the bit/byte arithmetic processing.

Further, while the example shown in FIG. 4A and FIG. 4B illustrate the case of the file structure of 32 bit×16 registers, the register structure of the exemplary embodiment is not limited only to that structure. It is also possible to employ the registers of 16 bit each or to employ the file structure of 8 or 32 registers.

(Explanations Regarding Structures and Operations of Command Code of Coprocessor Command)

FIG. 5 is an explanatory chart showing an example of the structure of command codes of coprocessor commands of the coprocessor 11 shown in FIG. 2. In FIG. 5, only calculation commands within the coprocessor are shown as examples of a part of the coprocessor commands. Other than those, it is also possible to provide calculation commands between the control processor and the coprocessor, the setting command of the parameter register 60, and the like by setting the fixed bit of the 21st to 22nd bits within the command codes to be other than "11". The 23rd to 31st bits and the 8th to 11th bits take fixed values.

The 12th to 15th codes show the operation codes (OP: command type). OP=O(SCRAM) is a scrambling processing command, which is a command for performing scrambling processing (SCRAM) on the data of an input register (crs) and outputting to an output register (crd). Note that both crs on the 4th to 7th bits and crd on the 0th to 3rd bits are the numbers of the multi-purpose registers within the register file (REG) 23 of the coprocessor 11, and immediate value (imm5) of the 16th to 20th bits show that the scrambling processing is performed in parallel (at once) for the number of bits written with the immediate value (imm5) (1 to 8) from the LSB side. It is possible to perform parallel processing of 8 bits (1 byte) at the most with a single command.

Further, this can be achieved by setting in advance the operation mode setting, the TAP initial value setting, and the generation polynomial specification setting required for dealing with the scrambling processing of a plurality of wireless systems to the parameter register 60.

OP=1 (CONV) is convolution encoding processing. In this case, the output data bit number changes according to the coding rate set by the parameter register. Thus, the output data bit number for the input data bit number (1 to 8) set with the immediate value (imm5) becomes the value twice or three times of that number (24 bits at the maximum).

OP=2 (CRC) is a CRC encoding processing command. In this case, as in the case of the above-described scrambling processing (SCRAM), it is possible to process the data of 8 bits at the maximum with a single command. The output data bit number matches with the input data bit number designated with the immediate value (imm5) of the 16th to 20th bits.

Note that the convolution encoding processing command (CONV) and the CRC encoding processing command (CRC) of OP=1 and 2 also can deal with a plurality of wireless systems through setting the operation mode setting, the TAP initial value setting, and the generation polynomial specification setting by using the parameter register 60 as in the case of the scrambling processing command of OP=0.

Further, for those SCRAM, CONV, CRC, a plurality of bits of the processing that normally requires a plurality of cycles for processing 1 bit with the regular processor processing can be processed with a single cycle since exclusive parallel calculation circuits 50, 51, and 52 to be described later are mounted, respectively, within the exclusive unit (ALU) 22.

OP=3 (SHL) is a left shift calculation command (crd=crs<<imm5), and OP=4 (SHR) is a right shift calculation command (crd=crs>>imm5). Both of those are the commands frequently used in the bit calculation processing, so that both are also mounted within the coprocessor 11.

Further, OP=5 (PERM) is a bit connection/rearrange calculation command, with which connection/rearrange processing is performed on the 16 bits from the LSB (lowermost bit) side at the maximum among the input registers (crs) and the result is outputted to the output register (crd). Note here that the order of outputting the output data of the 16 bits at the maximum is set in advance by using the parameter registers of 64 bits (32-bit registers×2 as a pair), and the parameter to be used is designated by using the parameter register number (cp). This makes it possible to achieve the quick and flexible bit connection/rearrange processing.

With this processing, the output of 1 bit is selected from the input data of 16 bits. Thus, setting of 64 bits with 4 bits×16 is required. Regarding this bit connection/rearrange calculation command (PERM), a plurality of bits can also be processed in parallel with a single command by providing the exclusive calculation circuit 53 within the exclusive unit (ALU) 22.

Further, OP=6 (MSKC2C) and OP=7 (MSKP2C) are inter-register transfer command (MASK&MOVE), and both are the commands for copying the number of bits designated with the immediate values (imm5) (1 to 31) of the 16th to 20th bits from the LSB side. Note here that OP=7 (MSKC2C) is a transfer command (crd=MSK (crs, imm5)) between the register files (REG) 23, and OP=8 (MSKP2C) is an inter-register transfer command (crd=MSK (cp, imm5)) from the parameter register 60 to the register file (REG) 23.

While only the calculation commands within the coprocessor are illustrated as the examples of a part of the coprocessor commands in FIG. 5, it is also possible to have the calculation commands between the control processor and the co-processor, the setting command of the parameter register 60, and the like in addition to those by changing the fixed bits of the 21st to 22nd bits within the command codes.

As an example of the calculation command between the control processor and the coprocessor, the immediate value (imm5) part of each command that uses the immediate value (imm5) in the case of FIG. 5 may be set as the number (rs) of the multi-purpose register within the control processor 11 to make it as a variable but an immediate value. Further, it is possible to execute an inter-register transfer command and the like between the control processor and the coprocessor by designating the multi-purpose registers (rs, rd) within the control processor 11 to the input register and the output register of the register transfer command.

The setting command of the parameter register 60 is a command with which the immediate value or the value of the multi-purpose register within the control processor can be set to various kinds of parameter registers within the exclusive unit (ALU) 22 and the memory controllers (LMC, SMC) 20 to 21.

(Explanations of Structures and Operations of Each Calculator within Exclusive Unit (ALU) 22)

Hereinafter, structures of each of the calculators provided to the exclusive unit (ALU) 22 shown in FIG. 2 will be described.

(Explanations of Structures and Operations of Scrambling Circuit (SCRAM) 50)

Figure 6:
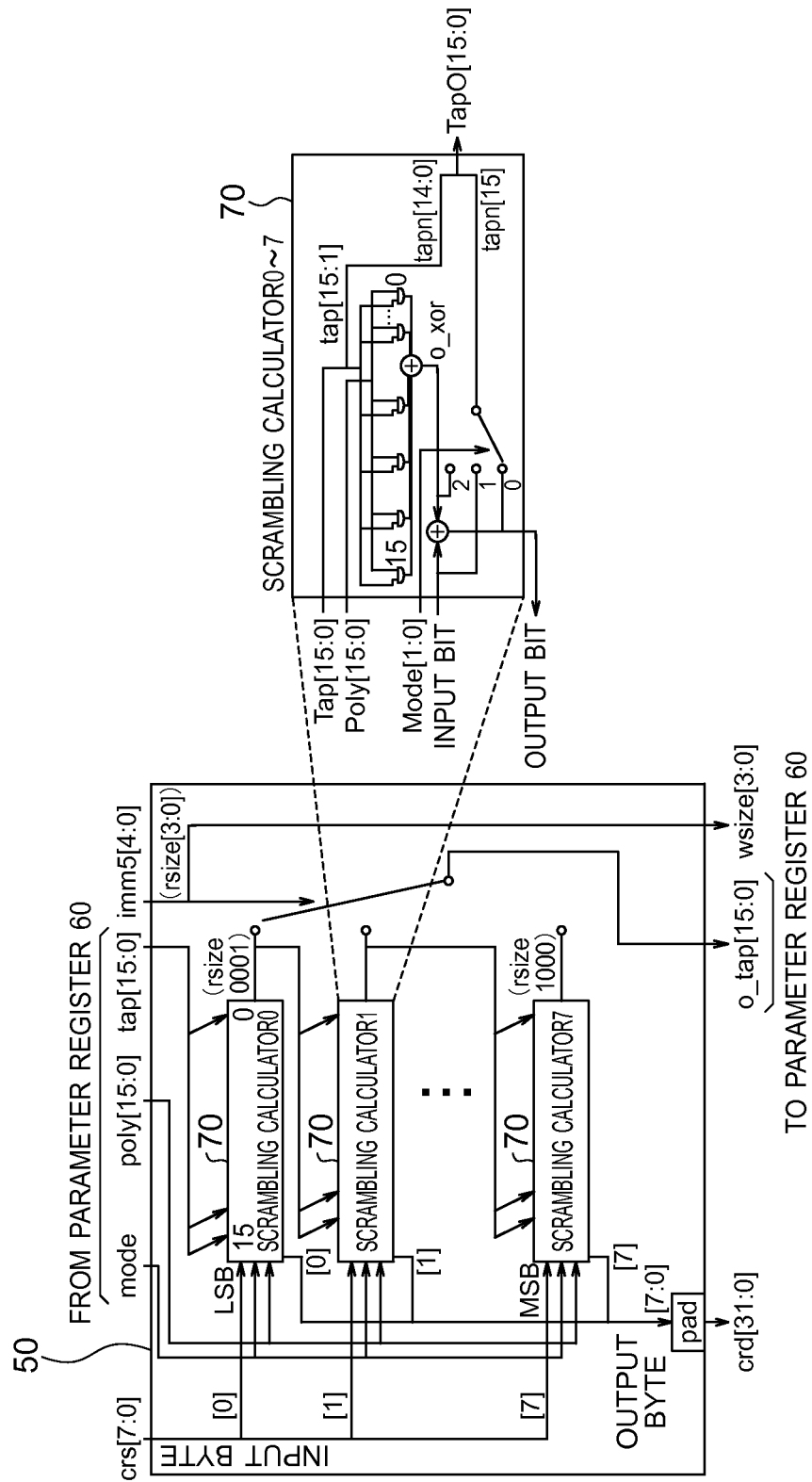
FIG. 6 is an explanatory chart showing an example of a structure of a scrambling circuit (SCRAM) within an exclusive arithmetic unit (ALU) shown in FIG. 2.

FIG. 6 is an explanatory chart showing an example of the structure of the scrambling circuit (SCRAM) 50 within the exclusive unit (ALU) 22 shown in FIG. 2. As the interface, the scrambling circuit (SCRAM) 50 has each of the input data (crs), the output data (crd), the operation mode (mode), the generation polynomial (poly), the calculation bit number (imm5), the TAP initial value (tap), and the TAP output value (o_tap). Further, the calculation bit number (imm5) is outputted towards the writing data packing circuit 32 as the writing data size (wsize).

The scrambling circuit (SCRAM) 50 can deal with the scrambling processing algorithm of various kinds of wireless systems in a programmable manner, since the parameters of the operation mode (mode) and the generation polynomial (poly) can be set by using the parameter register 60.

The scrambling circuit (SCRAM) 50 can designate the bit number processed with a single command thereof by the calculation bit number (imm5). Further, the TAP initial value (tap) can also be designated by using the parameter register 60. After the processing of one command, the value of the parameter register is also updated by selecting and outputting the TAP value (o_tap) that is updated for the number of calculation bits designated by the calculation bit number (imm5).

The updated TAP value is used as the TAP initial value at the time of the next scrambling processing command. Thus, through repeatedly executing the scrambling processing command, the scrambling circuit (SCRAM) 50 can perform scrambling processing (de-scrambling processing) for a long stream data sequence of 8 bits or more.

The scrambling circuit (SCRAM) 50 is achieved by connecting a plurality of scrambling calculators 70 that process 1 bit. There are eight of those provided in the case shown in FIG. 6, and 8 bits at the maximum can be processed with a single command in this case. The operation mode setting (Mode) and the generation polynomial setting (Poly) are basically the static parameters. Therefore, those are inputted in parallel to each scrambling calculator 70, and the input data (crs) is inputted to each scrambling calculator 70, respectively, by every [7:0] bit.

The TAP value (Tap) is updated by the calculation result of the previous bit. Thus, the TAP output value (TapO) of the previous scrambling calculator 70 is connected as the TAP input value (Tap) of the latter scrambling calculator 70.

As the structure and the operation of the scrambling calculator 70 for 1 bit, an AND operation (AND) of the inputted TAP value (Tap) and the generation polynomial (Poly) is performed, and then the result acquired by performing an exclusive OR (XOR) of the input bit on the value (o_xor) of the exclusive OR (XOR) of each bit is outputted as the output bit.

Further, regarding the TAP output, the inputted TAP value (Tap) is outputted by being shifted for the bits other than the highest-order bit. For the highest-order bit, whether to output o_xor as it is, to output the input bit value, or to output the exclusive OR (XOR) value of o_xor and the input bit vary depending on the kinds of wiring systems. Therefore, the one selected by the operation mode setting (Mode) is outputted as the output bit.

"LSB" in FIG. 6 means "Least Significant Bit", i.e., "lowest-order bit". Further, "pad" is padding, and it means the processing with which the higher-order 24 bits of "0" is added to the data of 8 bits to be outputted as 32-bit data, for example.

As described above, through employing the structure where the operation mode (mode) and the generation polynomial (poly) are set by using the parameter register 60 and the parameter registers is updated while calculating the TAP value (tap) as the structure and the operations of the scrambling circuit (SCRAM) 50, it is possible to deal with the scrambling/de-scrambling processing of various kinds of wireless systems in a programmable manner.

Further, through connecting a plurality of (e.g., eight) the scrambling calculators 70 that process 1 bit, it is possible to process a plurality of bits in parallel (at once) with a single command (1 cycle).

Further, through repeatedly executing the scrambling processing command (SCRAM) by using for statement or the like while operating the memory controllers 20 to 21 (CR2, CR3 registers and the like), it is possible to execute the scrambling processing (de-scrambling processing) for the long stream data sequence stored in the local memory or the external shared memory with the throughput of 8 bits/cycle in the case of the circuit structure shown in FIG. 6.

(Explanations of Structures and Operations of Convolution Encoder (CONV) 51)

Figure 7:
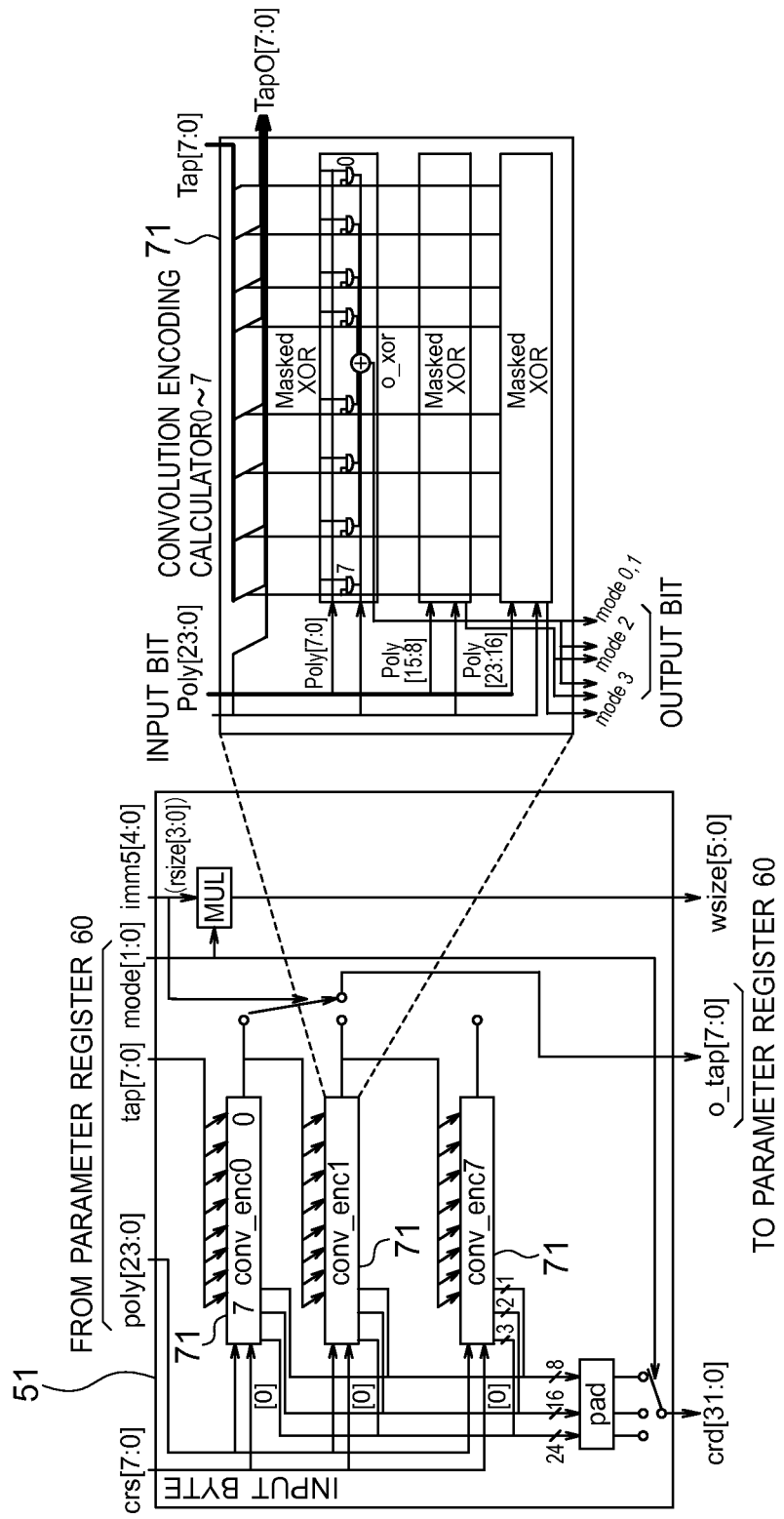
FIG. 7 is an explanatory chart showing an example of a structure a convolution encoder (CONV) within the exclusive arithmetic unit (ALU) shown in FIG. 2.

FIG. 7 is an explanatory chart showing an example of the structure of the convolution encoder (CONV) 51 within the exclusive unit (ALU) 22 shown in FIG. 2. As in the case of the scrambling circuit (ACRAM) 50 shown in FIG. 6, the convolution encoder (CONV) 51 has each of the input data (crs), the output data (crd), the operation mode (mode), the generation polynomial (poly), the calculation bit number (imm5), the TAP initial value (tap), and the TAP output value (o_tap) as the interfaces thereof. Further, the value acquired by multiplying the calculation bit number (imm5) to the operation mode (mode) is outputted towards the writing data packing circuit 32 as the writing data size (wsize).

The convolution encoder (CONV) 51 can deal with the convolution encoding processing algorithm of various kinds of wiring systems in a programmable manner, since the parameters of the operation mode (mode) and the generation polynomial (poly) can be set by using the parameter register 60.

Note here that the operation mode (mode) corresponds to the encoding rate (1, ½, ⅓). Regarding the generation polynomial (poly), 8 bits each such as poly [7:0], [15:8]. [23:16] are allotted to three sequences at the maximum according to the encoding rate.

The convolution encoder (CONV) 51 can designate the input bit number processed with a single command thereof by the calculation bit number (imm5). Further, the TAP initial value (tap) can also be designated by using the parameter register 60. After the processing of one command, the value of the parameter register is also updated by outputting the TAP value (o_tap) that is updated for the calculation bit number designated by the calculation bit number (imm5).

The updated TAP value is used as the TAP initial value at the time of the next convolution encoding processing command. Thus, through repeatedly executing the convolution encoding processing command, it is possible to perform the convolution encoding processing for a long stream data sequence of 8 bits or more.

The convolution encoder (CONV) 51 is achieved by connecting a plurality of convolution encoding calculators 71 that process 1 bit. There are eight of those provided in the case shown in FIG. 7, and 8 bits at the maximum can be processed with a single command in this case. The operation mode setting (Mode) designating the encoding rate and the generation polynomial setting (Poly) are basically the static parameters. Therefore, those are inputted in parallel to each convolution encoding calculator 71, and the input data (crs) is inputted to each convolution encoding calculator 71, respectively, by every [7:0] bit.

As the output data of each convolution encoding calculator 71, 1 bit to 3 bits of data corresponding to each encoding rate is outputted. The TAP value (Tap) is updated by the calculation result of the previous bit, so that the TAP output value (TapO) of the previous convolution encoding calculator 71 is connected as the TAP input value (Tap) of the latter convolution encoding calculator 71.

As the structure and operation of the convolution encoding calculator 71 for 1 bit, three encoding calculators (Masked XOR) are provided inside thereof, and the value (o_xor) acquired by performing an AND operation (AND) of the inputted TAP value (Tap) and the generation polynomial (Poly) and then performing the exclusive OR (XOR) of the input bit and each bit is outputted as the output bit.

As the output bit, 3 bits at the maximum are outputted according to the encoding rate for the input of 1 bit. Further, the TAP output (TapO) is outputted by shifting the TAP value (Tap) while having the input bit as the highest-order bit. Incidentally, "pad" in FIG. 7 means "padding" as in the case of FIG. 6.

As described above, through employing the structure where the operation mode (mode) as the encoding rate and the generation polynomial (poly) are set by using the parameter register 60 and the parameter registers is updated while calculating the TAP value (tap) as the structure and the operations of the convolution encoder (CONV) 51, it is possible to deal with the convolution encoding processing of various kinds of wireless systems in a programmable manner.

Further, through connecting a plurality of (e.g., eight) the convolution encoding calculators 71 that process 1 bit, it is possible to process a plurality of bits in parallel (at once) with a single command (1 cycle).

Further, through executing the convolution encoding processing command (CONV) by using for statement or the like while operating the memory controllers 20 to 21 (CR2, CR3 registers and the like), it is possible to execute the convolution encoding processing for the long stream data sequence stored in the local memory or the external shared memory with the throughput of 8 bits/cycle for the input bit in the case of the circuit structure shown in FIG. 7.

(Explanations of Structures and Operations of CRC Encoder (CRC) 52)

Figure 8:
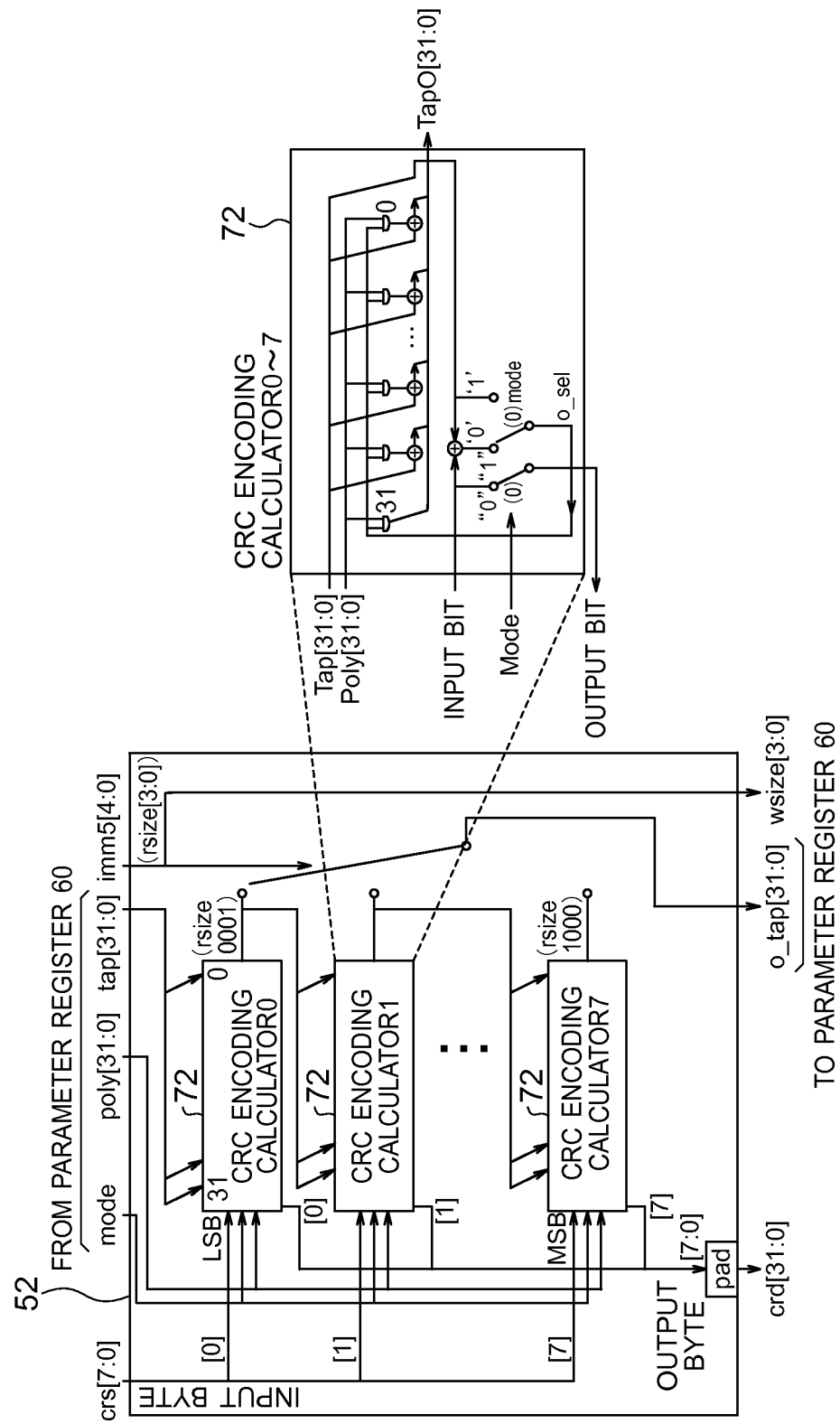
FIG. 8 is an explanatory chart showing an example of a structure of a CRC encoder (CRC) within the exclusive arithmetic unit (ALU) shown in FIG. 2.

FIG. 8 is an explanatory chart showing an example of the structure of the CRC encoder (CRC) 52 within the exclusive unit (ALU) 22 shown in FIG. 2. As in the case of the scrambling circuit (ACRAM) 50 and the like, the CRC encoder (CRC) 52 has each of the input data (crs), the output data (crd), the operation mode (mode), the generation polynomial (poly), the calculation bit number (imm5), the TAP initial value (tap), and the TAP output value (o_tap) as the interfaces thereof. Further, the calculation bit number (imm5) is outputted towards the writing data packing circuit 32 as the writing data size (wsize).

The CRC encoder (CRC) 52 can deal with the CRC encoding processing algorithm of various kinds of wireless systems in a programmable manner, since the parameters of the operation mode (mode) and the generation polynomial (poly) can be set by using the parameter register 60.

The CRC encoder (CRC) 52 can designate the bit number processed with a single command thereof by the calculation bit number (imm5). Further, the TAP initial value (tap) can also be designated by using the parameter register 60. After the processing of one command, the value of the parameter register is also updated by selecting and outputting the TAP value (o_tap) that is updated for the calculation bit number designated by the calculation bit number (imm5).

"LSB" in FIG. 8 means "lowest-order bit" as in the case of FIG. 6, and "pad" also means padding as in the case of FIG. 6 as well. Further, "MSB" means "Most Significant Bit", i.e., "the highest-order bit".

The updated TAP value is used as the TAP initial value at the time of the next CRC encoding processing command. Thus, through repeatedly executing the CRC encoding processing command, it is possible to perform the CRC encoding processing for a long stream data sequence of 8 bits or more.

The CRC encoder (CRC) 52 is achieved by connecting a plurality of CRC encoding calculators 72 that process 1 bit. There are eight of those provided in the case shown in FIG. 8, and 8 bits at the maximum can be processed with a single command in this case. The operation mode setting (Mode) and the generation polynomial setting (Poly) are basically the static parameters. Therefore, those are inputted in parallel to each CRC encoding calculator 72, and the input data (crs) is inputted to each CRC encoding calculator 72 by every [7:0] bit.

The TAP value (Tap) is updated by the calculation result of the previous bit. Thus, the TAP output value (TapO) of the previous CRC encoding calculator 72 is connected as the TAP input value (Tap) of the latter CRC encoding calculator 72. As the structure and the operation of the CRC encoding calculator 72 for 1 bit, whether to output the exclusive OR (XOR) value of the lowest-order bit of the inputted TAP value (Tap) and the input bit or to output the input bit as it is varies depending on the kinds of wiring systems. Therefore, the one selected by the operation mode setting (Mode) is outputted as the output bit.

Further, for the TAP output, the lowest-order bit of the inputted TAP value (Tap) or the result acquired by performing an exclusive OR operation (XOR) of that bit and the input bit is selected (o_sel) by the operation mode setting (Mode), and the result acquired by performing an exclusive OR operation (XOR) of the data acquired by performing an AND operation (AND) of that bit sequence and the generation polynomial (Poly) and the data acquired by shifting the inputted TAP value (Tap) is outputted.

As described above, through employing the structure where the operation mode (mode) as the encoding rate and the generation polynomial (poly) are set by using the parameter register 60 and the parameter registers is updated while calculating the TAP value (tap) as the structure and the operations of the CRC encoder (CRC) 52, it is possible to deal with the CRC encoding processing of various kinds of wireless systems in a programmable manner.

Further, through connecting a plurality of (e.g., eight) the CRC encoding calculators 72 that process 1 bit, it is possible to process a plurality of bits in parallel (at once) with a single command (1 cycle).

Further, through repeatedly executing the CRC encoding processing command (CRC) by using for statement or the like while operating the memory controllers 20 to 21 (CR2, CR3 registers and the like), it is possible to execute the CRC encoding processing or CRC judgment processing for the long stream data sequence stored in the local memory or the external shared memory with the throughput of 8 bits/cycle in the case of the circuit structure shown in FIG. 8.

Further, the circuit structure shown in FIG. 8 is provided with the TAP registers for 32 bits, so that it is possible to deal with various kinds of CRC encoding processing such as CRC-8, CRC-16, CRC-24, CRC-32, and the like. The result data acquired after the CRC encoding is stored in a CRC_TAP register within the parameter register 60.

(Explanations of Structures and Operations of Bit Connection/Rearrange Circuit (PERM) 53)

Figure 9:
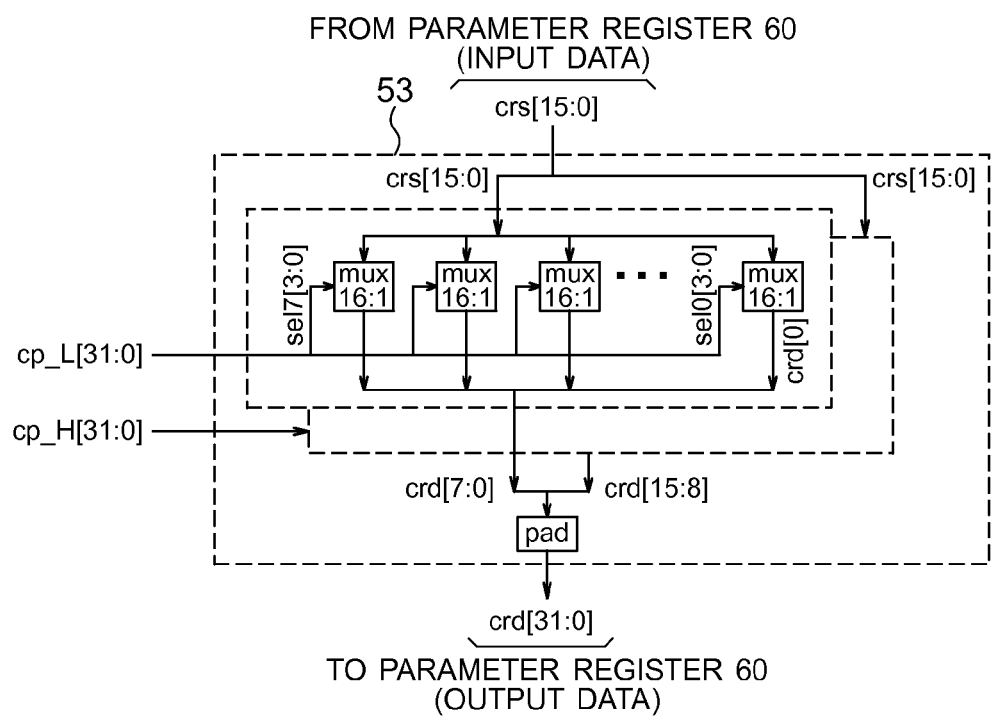
FIG. 9 is an explanatory chart showing an example of a structure of a bit connection/rearrange (concatenation/reorder) circuit (PERM) within the exclusive arithmetic unit (ALU) shown in FIG. 2.

FIG. 9 is an explanatory chart showing an example of the structure of the bit connection/rearrange circuit (PERM) 53 within the exclusive unit (ALU) 22 shown in FIG. 2. The bit connection/rearrange circuit (PERM) 53 has each of the input data (crs), the output data (crd), and a bit selection setting parameter (cp_L, cp_H) as the interfaces thereof. Further, it is possible to control the calculation bit number by fixedly setting it in the writing data packing circuit 32.

As the bit selection setting parameter (cp_L, cp_H), which bit out of the input data bits (16 bits) is to be selected and outputted is set for each output bit. A multiplexer (MUX) of sixteen inputs and one output is provided for each output bit, and 4 bits each are used to be set as the bit selection setting. Therefore, the bit connection/rearrange circuit (PERM) 53 performs the parameter setting of 64 bits in total by combining the sixteen multiplexers (MUX) for 16 bits in total with the two registers cp_L and cp_H as the 32-bit registers.

As described above, the bit connection/rearrange circuit (PERM) 53 can arbitrarily set the output bit order for the input data of 16 bits. Therefore, it is possible to deal with the bit connection/rearrange processing, the bit repetition processing, and the bit puncture (deletion) processing of various kinds of wireless systems in a programmable manner.

Further, through repeatedly executing the bit connection/rearrange command (PERM) by using for statement or the like while operating the memory controllers 20 to 21 (CR2, CR3 registers and the like), the readout data packing circuit 32, and the data packing circuit 42, it is possible to execute the bit connection/rearrange processing, the bit repetition processing, and the bit puncture (deletion processing) for the long stream data sequence stored in the local memory or the external shared memory with the throughput of 16 bits/cycle input bit in the case of the circuit structure shown in FIG. 9.

(Structures and Operations of Memory Controllers 20 to 21)

The memory controllers 20 to 21 are memory controllers for making an access to the local memory (data memory 102) and the external shared memory in parallel to the arithmetic processing of the processor 10 and the coprocessor 11. The memory controllers 20 to 21 include, inside thereof, the writing address generator 30, the writing data FIFO circuit 31, the writing data packing circuit 32, the readout address generator 40, the readout data FIFO circuit 41, the readout data packing circuit 42, and the like. Hereinafter, each of those elements will be described.

(Structures and Operations of Memory Writing Circuits 30, 31, 32)

Figure 10:
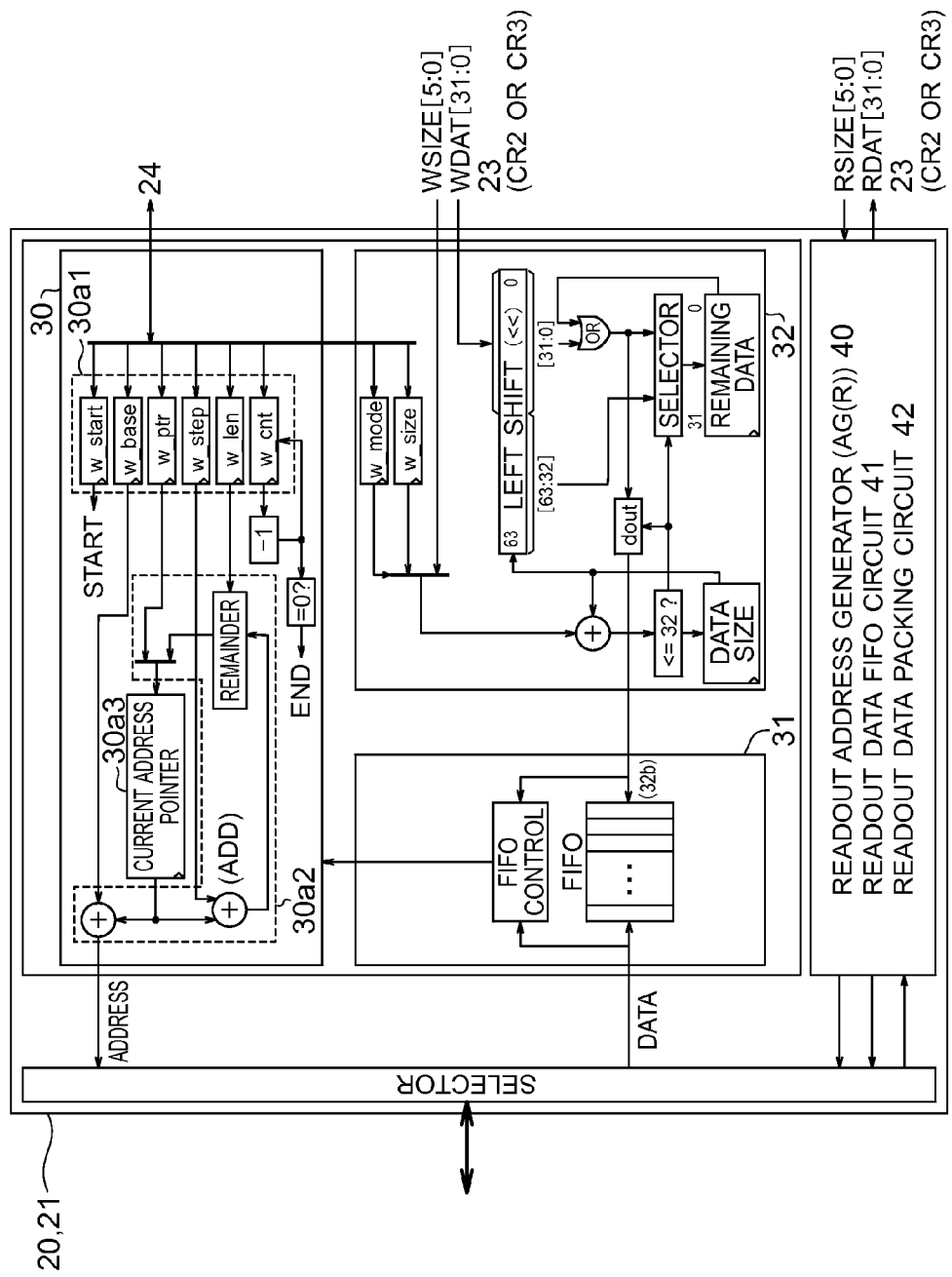
FIG. 10 is an explanatory chart showing more detailed structures and operations of a writing address generator, a writing data FIFO circuit, and a writing data packing circuit of a memory controller shown in FIG. 2.

FIG. 10 is an explanatory chart showing more detailed structures and operations of the writing address generator 30, the writing data FIFO circuit 31, and the writing data packing circuit 32 in the memory controllers 20 to 21 shown in FIG. 2.

When the stream data as the processing result is written to the memory from the coprocessor 11 via CR2 or CR3, the writing address generator 30, the writing data FIFO circuit 31, and the writing data packing circuit 32 within the memory controllers 20 to 21 are used.

The writing address generator 30 includes control registers 30a1 which stores respective numerical values thereof, such as a start register (w_start), a base address register (w_base), an initial pointer register (w_ptr), a step register (w_step), a memory length register (w_len), and an access time register (w_cnt).

The writing address generator 30 includes an address calculator 30a2 which generates and issues an address automatically every time there is a data output request from the writing data FIFO circuit 31, when values are set to those address generators 30a1 and the generators are started by a parameter setting command of the coprocessor 11. The address calculator 30a2 basically issues an address acquired by adding a current address pointer to the base address (w_base). The value of a current address pointer 30a3 is updated every time an address is outputted by having the value of the initial pointer (w_ptr) as the initial value.

The address calculator 30a2 adds the step number (w_step) to the current address with a 32-bit address unit every time an address is outputted and performs a remainder (Modulo) calculation thereon with the memory length size (w_len) to take it as the data of the next current address pointer 30a3.

For that, the writing address generator 30 includes the current address pointer register 20a3, adders (two), remainder calculators (comparator and subtractor), a comparator as well as a subtractor for counting the number of accesses, etc. other than the control register 30a1. With such structures, it is possible to generate flexible address patterns, e.g., writing at continuous addresses in an ascending order or a descending order, writing at arbitrary address intervals through controlling the step number (w_step), and writing started from the middle of the memory to the last and then returned to the head to start writing through controlling the memory length (w_len) for an arbitrary memory region.

The writing data outputted from the exclusive unit (ALU) 22 to the CR2 register or the CR3 register is outputted to the memory via the writing data packing circuit 32 and the writing data FIFO circuit 31. The writing data packing circuit 32 is a circuit for packing the writing data in a unit of 32 bits.

The writing data packing circuit 32 combines the data (WDAT) of the writing data size (WSIZE) designated from the exclusive unit (ALU) 22 side and the data (remaining data size register) of the data size (data size register) remained within the writing data packing circuit 32 currently. At this time, the processing data in the case of the example of this exemplary embodiment is in a data format of the LSB-First order. Thus, the writing data packing circuit 32 left-shifts the inputted data (WDAT) for the amount of the remaining effective data size (data size register) and performs OR processing with the remaining data (remaining data register) to combine it to the MSB side.

In a case where the effective bit number of the combined data is less than 32 bits, the data is stored to the data register (remaining data register) as it is and not outputted. In the meantime, in a case where the combined data is of 32 bits or more, the data of 32 bits on the LSB side is outputted to the writing data FIFO circuit 31, and the data of the remaining 32 bits on the higher-order side ([63:32]) is stored to the data register (remaining data register).

Through providing such writing data packing circuit 32, the shift processing and the packing processing of the data can be executed automatically (the shift calculation processing on the processor side is unnecessary). Thus, it is possible to perform the stream data processing without having overhead in the processing cycle number even when the data processing unit (output data size) on the exclusive unit (ALU) 22 side is other than 32 bits. In a case of a command (PERM command or the like) where desired processing data size (WSIZE) cannot be outputted from the exclusive unit (ALU) 22 side, it is possible to set the fixed size by using the fixed size setting register (w_mode, w_size).

Further, every time the data of 32 bits is inputted to the writing data packing circuit 32, the data is outputted to the writing data FIFO circuit 31. When the data is inputted, the writing data FIFO circuit 31 cooperates with the writing address generator 30 to store the data to the address on the memory in order shown by the writing address generator 30.

As described, through outputting the data by using FIFO, it is possible to make an access to the memory in parallel to the calculation command of the control processor 10 and the coprocessor 11. Thus, there is no influence upon the calculation command even when the memory side is in waiting (Wait) (waiting for processing), so that it is possible to hide the memory access latency of the writing data.

Even in a case where the writing data FIFO circuit 31 becomes Full due to the waiting (Wait) on the memory side, the coprocessor command processing can be continued properly through providing a waiting (Wait) control mechanism for waiting (Wait) the coprocessor command on the exclusive unit (ALU) 22 side via the writing data packing circuit 32 and the register file (REG) 23.

Figure 11:
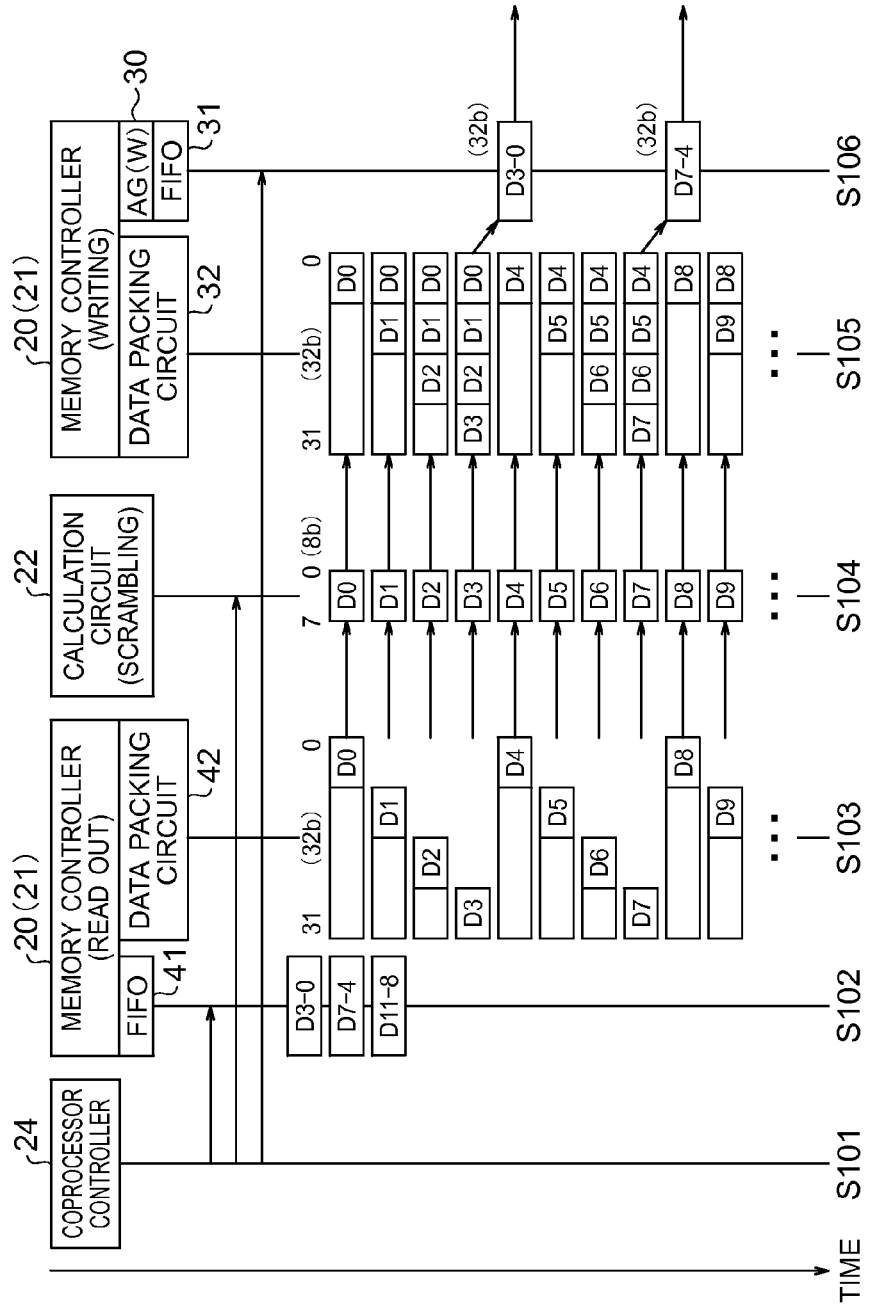
FIG. 11 is an explanatory chart showing an example of an operation sequence when data is written to a memory from the coprocessor via a CR2 or CR3 register in each of memory writing circuits of the memory controller shown in FIG. 10.

FIG. 11 is an explanatory chart showing an example of the operation sequence when writing data to the memory from the coprocessor 11 via the CR2 or CR3 register in each of the memory writing circuits of the memory controllers 20 to 21 shown in FIG. 10.

FIG. 11 shows an example of the case where the scrambling processing is performed on the stream data on the memory (repetition processing of 8-bit unit). First, according to the parameter register setting command of the coprocessor 11, the parameter setting for the processing is set to the parameter register 60 within the exclusive unit (ALU) 22, and the parameter setting and activation of each of the address generators 30 and 40 within the memory controllers 20 to 21 (LMC, SMC) are performed (step S101).

The memory controller on the readout side independently reads out the data from the memory, and the processing data is stored sequentially to the readout data FIFO circuit 41 (split transaction, step S102). In a case where the scrambling processing for the stream data is performed, for example, the scrambling processing command (SCRAM) (CR2(3) =SCRAM (CR2 (3), 8)) is repeated with for statement and the like.

With the function of the readout data packing circuit 42 to be described later, the exclusive unit (ALU) 22 reads out the data with a unit of 8 bits from the data of 32-bit unit (step S103). Further, the exclusive unit (ALU) 22 repeatedly performs the scrambling processing of 8 bits (step S104), and continuously outputs the processing result data to the memory controllers 20 to 21 via the CR2 (3) register (step S105).

In the memory controllers 20 to 21, the writing data packing circuit 32 performs the packing processing while shifting the processing result data, and outputs the data when it becomes the unit of 32 bits to an intended memory in order via the writing data FIFO circuit 31 (step S106).

Through such functions of the memory controllers 20 to 21 (the address generators 30 and 40, the data FIFO circuits 31 and 41, and the data packing circuits 32 and 42), the coprocessor 11 of the exemplary embodiment can perform the encoding/decoding processing such as the scrambling processing (de-scrambling processing) with the processing throughput of 8 bits/cycle.

(Structures and Operations of Memory Readout Circuits 40, 41, 42)

Figure 12:
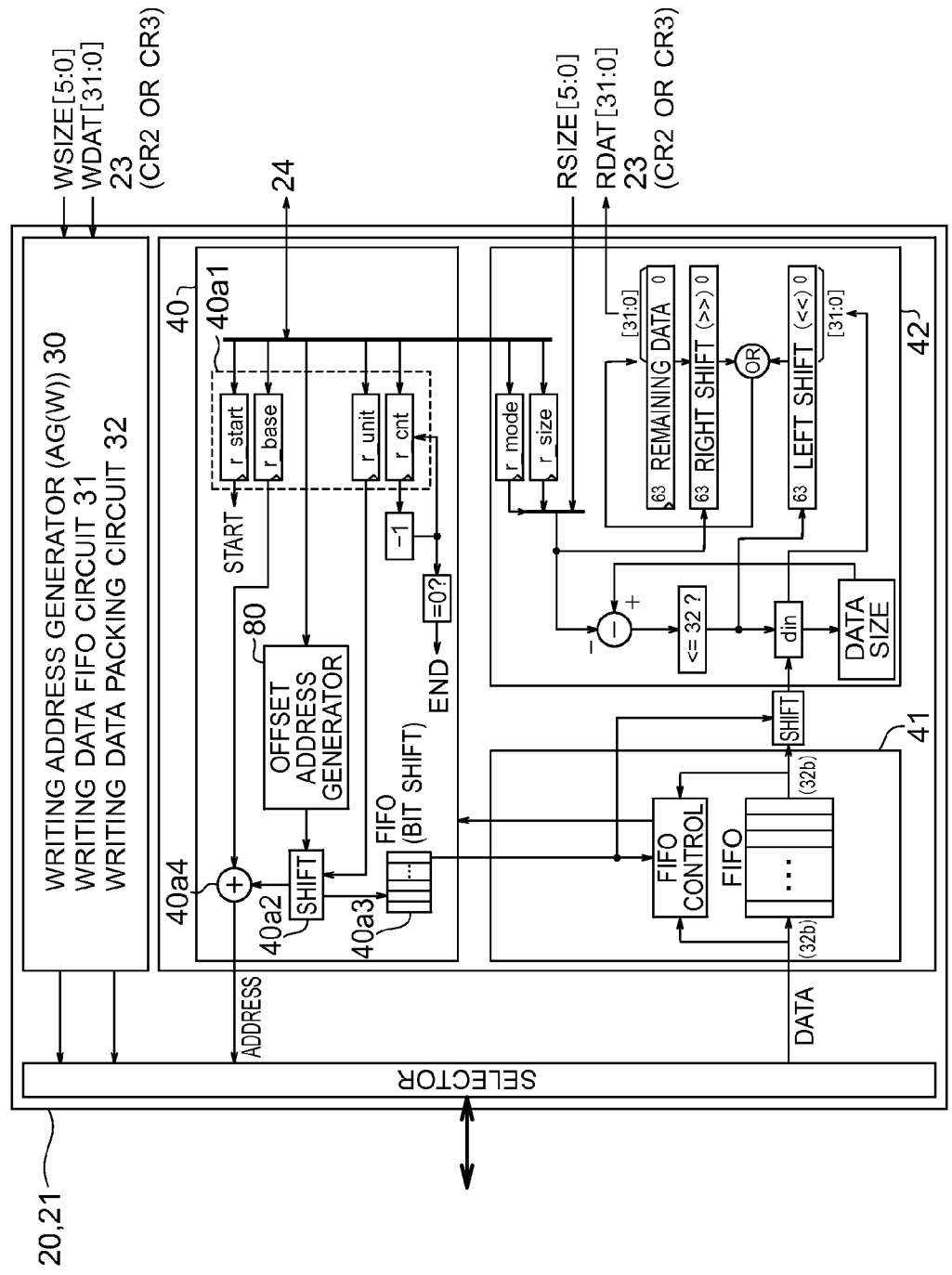
FIG. 12 is an explanatory chart showing more detailed structures and operations of a readout address generator, a readout data FIFO circuit, and a readout data packing circuit of a memory controller shown in FIG. 2.

FIG. 12 is an explanatory chart showing more detailed structures and operations of the readout address generator 40, the readout data FIFO circuit 41, and the readout data packing circuit 42 in the memory controllers 20 to 21 shown in FIG. 2.

When the coprocessor 11 reads out the stream data from the memory via the CR2 or CR3 register, the readout address generator 40, the readout data FIFO circuit 41, and the readout data packing circuit 42 within the memory controllers 20 to 21 are used.

The readout address generator 40 includes control registers 40a1 which stores respective numerical values thereof, such as a start register (r_start), a base address register (r_base), an offset address unit register (r_unit), an initial pointer register (r_ptr_xx), a step register (r_step_xx), a memory length register (r_len_xx), and an access time register (r_cnt).

The readout address generator 40 issues a readout address automatically and continuously for the access time (r_cnt) and reads out the data from the memory, when values are set to those control registers 40a1 and those registers are started by a parameter setting command of the coprocessor 11. The readout addresses are continuously and speculatively issued to deal with the split transaction at the time of reading.

The readout address generator 40 basically issues an address acquired by adding the offset address from the offset address generator 80 to the base address (r_base) by an address adder 40a4. Note here that the offset address generator 80 to be described later can calculate the offset with an arbitrary unit such as a bit unit, a byte (8 bits) unit, a word (32 bits) unit in order to deal with the bit interleave processing and the like of the encoding/decoding processing.

Therefore, the readout address generator 40 includes a shift circuit 40a2 which outputs at the time of output after shaping (shifting) it to the address unit of the memory by using the value of the offset address unit register (r_unit). At this time, when the offset address is generated with the bit unit or the byte unit, also provided is a bit shift FIFO 40a3 for storing the bit position information regarding the position where the intended bit (byte) is mapped in the read out 32-bit data.

The data (RDAT) read out from the memory is transferred to the exclusive ALU (unit) side via the readout data FIFO circuit 41 and the readout data packing circuit 42. The data (RDAT) read out from the memory is stored to the readout FIFO circuit 41 in order, and the data whose bit is shifted by the shift circuit 40a2 so that the intended bit is positioned on the LSB side by using the value of the bit position information of the bit shift FIFO is transferred to the readout data packing circuit 42.

At this time, the timing for issuing the readout access on the address generator 40 side is controlled according to the capacity of each FIFO so that the bit shift FIFO 40a3 and the readout data FIFO do not overflow. When the data is read out from the exclusive unit (ALU) 22 side via the CR2 or CR3 register, the readout data packing circuit 42 right-shifts the data (remaining data register) remained within the readout data packing circuit currently according to the value of the designated read out data size (RSIZE).

That is, the data of the readout data size (RSIZE) is removed, and the remaining data is stored on the LSB side. At this time, when the effective bit number of the remaining data is 32 bits or more based on the difference between the data size (data size register) remained within the readout data packing circuit currently and the readout data size (RSIZE), the read out data from the readout data FIFO circuit 41 side is not acquired.

In the meantime, when the effective bit number of the remaining data is less than 32 bits, the next readout data is acquired from the readout data FIFO circuit 41 side. The acquired readout data is left-shifted for the size of the remaining data and combined to the MSB side of the remaining data, and the combined data is stored to the data register (remaining data register) so that it can be read out from the exclusive unit (ALU) 22 side in a next cycle.

Through providing such readout data packing circuit 42, the shift processing and the packing processing of the data can be executed automatically (the shift calculation processing on the processor side is unnecessary). Thus, it is possible to perform the stream data processing without having overhead in the processing cycle number even when the data processing unit (input data size) on the exclusive unit (ALU) 22 side is other than 32 bits.

In a case of a command (PERM command or the like) where an intended processing data size (RSIZE) cannot be outputted from the exclusive unit (ALU) 22 side, it is also possible to set the fixed size by using the fixed size setting register (r_mode, r_size).

In a case where intended data does not still exist within the readout data packing circuit 42 (the readout data FIFO circuit 41 is also empty) due to the waiting (Wait) or the like on the memory side, it is possible to continue the coprocessor command processing properly through also providing the waiting (Wait) control mechanism for waiting (Wait) the coprocessor command on the exclusive unit (ALU) 22 side via the writing data packing circuit 42 and the register file (REG) 23.

(Structure and Operations of Offset Address Generator)

Figure 13:
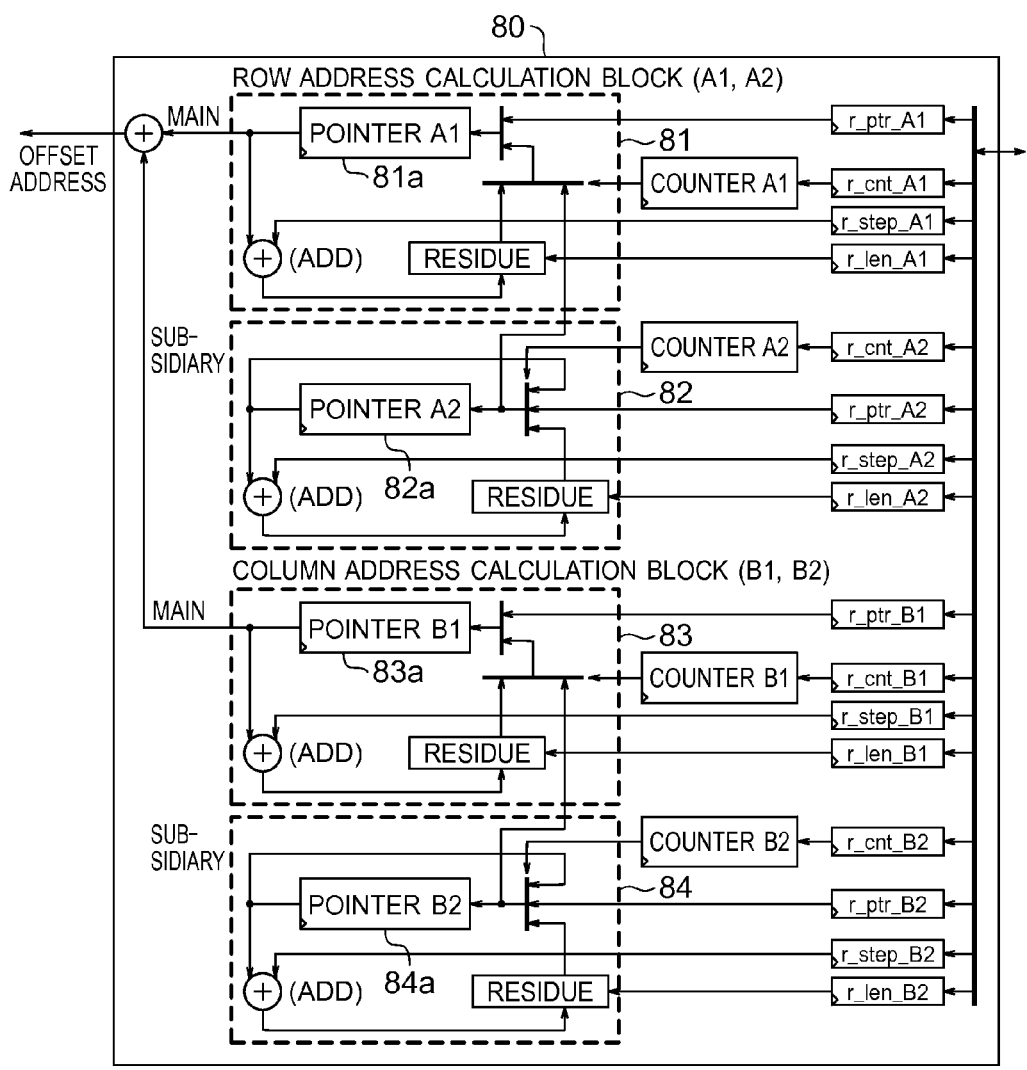
FIG. 13 is an explanatory chart showing a more detailed structure of an offset address generator within the readout address generator shown in FIG. 12.

FIG. 13 is an explanatory chart showing a more detailed structure of the offset address generator 80 within the readout address generator 40 shown in FIG. 12. The offset address generator 80 includes inside thereof two offset address calculation blocks (A, B) and one adder which adds the two outputs thereof in order to quickly and easily achieve various kinds of bit interleave processing (block interleave processing) in the encoding/decoding processing of various kinds of wireless systems.

Further, each of the offset address calculation blocks (A, B) of the offset address generator 80 is structured to further include two address calculators 81 to 82 (A1, A2) and 83 to 84 (B1, B2), respectively. That is, the offset address generator 80 includes a total of four address calculators 81 to 84 (A1, A2, B1, B2).

Each of the address calculators 81 to 84 (A1, A2, B1, B2) includes control registers such as the initial pointer register (rptr_xx), the step register (r_step_xx), the memory length register (r_len_xx), the count number register (r_cnt_xx), and the like.

As the actions of the address calculators 81, 83 (A1, B1) on the main side which actually outputs the address, first, the value of the initial pointer is updated every time an address is outputted by taking the value of the initial pointer (rptr_X1) as the initial value. Normally, every time an address is outputted, the value acquired by adding only the step number (r_step_X1) to the current address and performing a remainder (Modulo) calculation with the memory length size (r_len_X1) is the value of the next address pointers 81a, 83a. However, every time the address output number reaches the value of the count number register (r_cnt_X1), the value of the address pointers 81a, 83a is updated to the address calculated by the address calculators (A2, B2) not on the main side but on the subsidiary side.

In the meantime, in the address calculators 82, 84 (A2, B2) on the subsidiary side, the value of the initial pointer is first updated also every time an address is outputted for the number of the count number register (r_cnt_X2) by taking the value of the initial pointer (rptr_X2) as the initial value. The value acquired by adding only the step number (r_step_X2) to the current address and performing a remainder (Modulo) calculation with the memory length size (r_len_X1) is the value of the next address pointers 82a, 84a on the subsidiary side.

As described, to provide the two address calculators inside a single offset address calculation block (A, B) so that the address pointer on the main side can be updated to the value calculated on the subsidiary side for an every arbitrary access is for making it possible to deal with the block interleave processing and the like to be described later in a case where the offset is changed to a next column and an access is made again, e.g., in a case where address output of one column is completed and returned.

Further, through structuring the offset address generator 80 to include the two address calculation blocks (A, B) having two address calculators inside thereof for making it possible to add the output addresses of the both, it is possible to generate two-dimensional addresses which can deal with various kinds of bit interleave processing and block interleave processing with the processing throughput of 1 bit/cycle.

The two address calculation blocks (A, B) can generate two-dimensional addresses, e.g., one is used for calculating a row address of the block interleave processing, and the other is used for calculating a column address.

Figure 14:
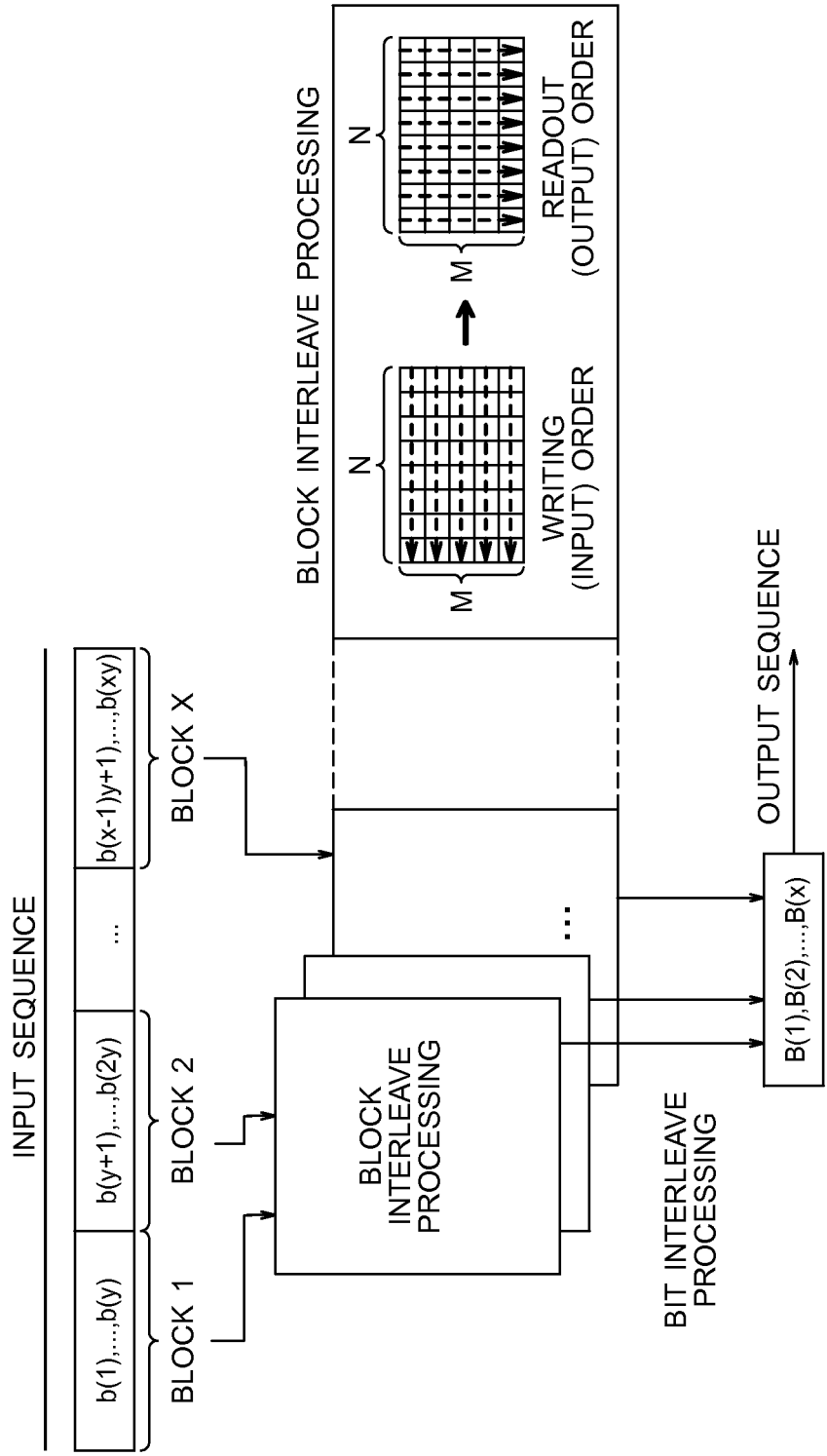
FIG. 14 is an explanatory chart showing an example of typical interleave processing in the encoding/decoding processing of the wireless communication executed by the offset address generator shown in FIG. 13.

FIG. 14 is an explanatory chart showing an example of the typical interleave processing of the encoding/decoding processing of the wireless communication executed by the offset address generator 80 shown in FIG. 13. As shown in FIG. 14, in the typical interleave processing, first, as the bit interleave processing, an input data sequence is divided into a plurality of blocks, and an output data sequence is structured so that the data is outputted in order from different blocks. Thereby, adjacent data are not outputted continuously.

Further, regarding the data output order from each block, the input data order and the output data order are set to be different within the block by performing the block interleave processing in each block. The block interleave processing is the processing where the input (writing) side executes writing by each row of a given data block constituted with M rows and N columns, and the output (readout) side executes reading by each column to change the data order.

Depending on the various kinds of wireless systems, there are the type where the writing start row and the readout start column of M rows and N columns are changed for each block to improve the randomness and the type where the output order from each block is cycled (cyclic shift processing) at the last output sequence. Further, the values of M and N of M rows and N columns vary depending on the wireless system, the inside parameters, and the like.

With the readout address generator 40 capable of dealing with the split transaction shown in FIG. 12 and FIG. 13 according to the exemplary embodiment, it is possible to continuously generate the address pattern corresponding to the bit interleave processing (block interleave processing) of the encoding processing shown in FIG. 14 and the bit de-interleave processing (block de-interleave processing) of the decoding processing that is the opposite processing. This makes it possible to deal with the processing with the processing throughput of 1 bit/cycle.

The input data sequence is stored on the memory in the bit order. When the interleave processing as shown in FIG. 14 is to be performed, it is achieved by calculating the row address of the input sequence on the address calculation A block side shown in FIG. 12 and calculating the column address of the input sequence on the address calculation block B side, for example. Specifically, the row address between the blocks is calculated by the address calculator A1, and the row address offset within the block is calculated by the address calculator A2, for example.

Further, through calculating the column address (column address offset) within each block by the address calculators B1, B2, it is possible to generate the address with the processing throughput of 1 bit/cycle.

That is, the step number for the address calculator A1 (r_step_A1) and the memory length (r_len_A1) are set to be able to jump the number of the addresses of one block for every cycle, and each count value (r_cnt_A1, r_cnt_A2) and the step number (r_step_A2) on the address calculator A2 side are set to shift one row of the M rows of the block interleave at the timing where generation for all the blocks are executed and returned to the first block. Further, the control register on the address calculation block B side is set to shift by one column among the N columns of the block interleave at the timing where generation for one column of the entire block is executed.

Figure 15:
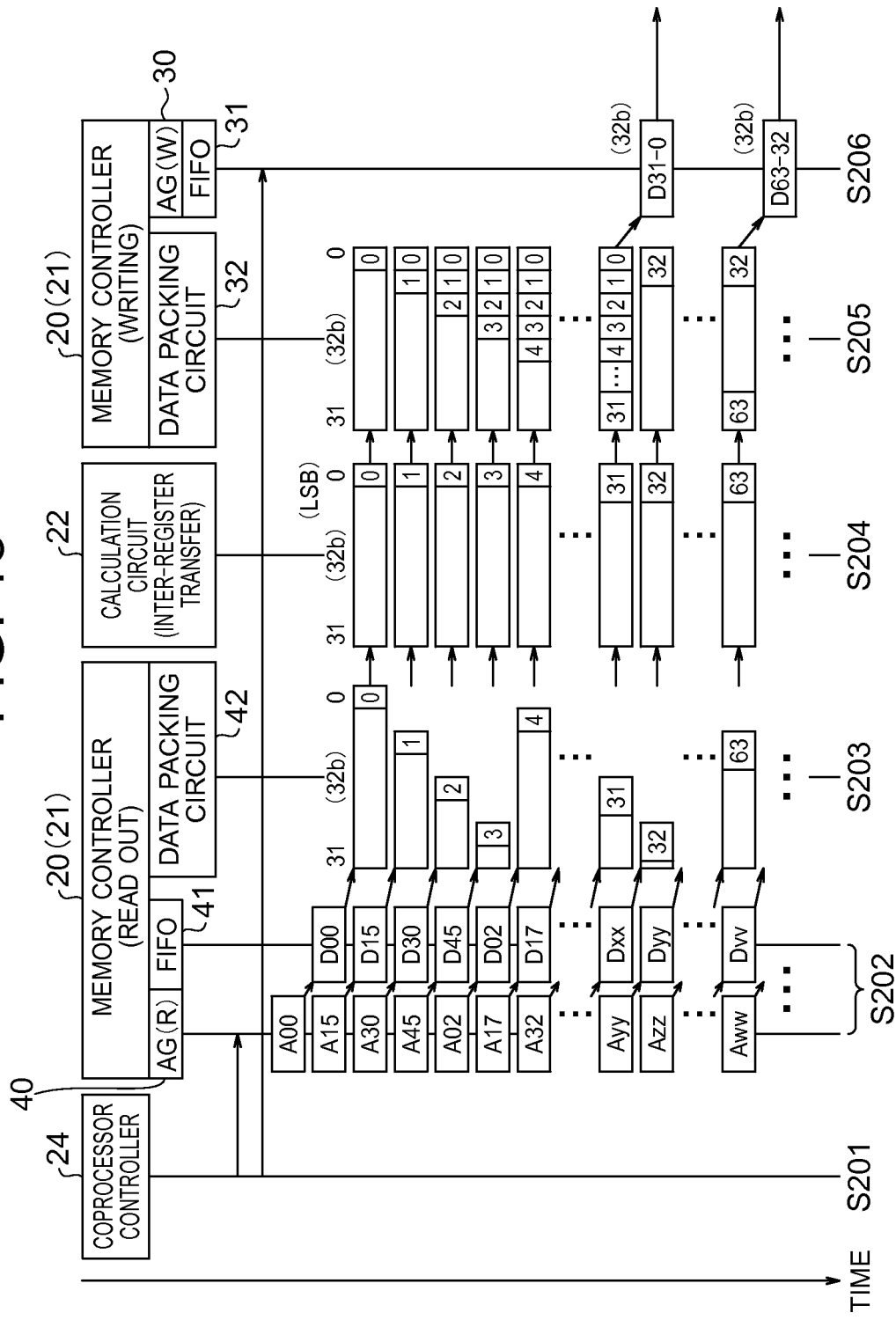
FIG. 15 is an explanatory chart showing an example of an operation sequence when data is written to a memory via a CR2 or CR3 register in each of memory readout circuits of the memory controller shown in FIG. 10.

FIG. 15 is an explanatory chart showing an example of the operation sequence of a case where data is written to the memory via the CR2 or CR3 register in each memory readout circuit of the memory controllers 20 to 21 shown in FIG. 10.

FIG. 15 shows an example of the case where the data is read out from the memory from the coprocessor 11 via the CR2 or the CR3 register in the bit order of the interleave processing, the data is shaped in the readout order, and the data is written to the memory via the CR2 or CR3 register.

First, the parameter setting and activation of each of the address generators 30 and 40 within the memory controllers 20 to 21 (LMC, SMC) are done by a parameter register setting command of the coprocessor (step S201). Particularly, the control register setting for each of the address calculators (A1, A2, B1, B2) is performed on the memory controller on the readout side for making it possible to correspond to the address pattern of the interleave processing.

The memory controller on the readout side independently reads out the data from the memory by the set address generation pattern, and sequentially stores the processing data to the readout data FIFO circuit 41 (step S202). At this time, the mapped position of an intended bit in the read out 32-bit data is stored to the bit shift FIFO simultaneously with the issue of the address. Thus, shift processing of the data is performed by the output of the readout data FIFO circuit 41 by using that value so that the intended bit data is positioned on the LSB side (step S203).

Further, in a case of executing the interleave processing, the exclusive unit (ALU) 22 repeats an inter-register transfer command (MASK&MOVE) (CR2 (3)=MSKC2C (CR2(3), 32) with for statement or the like (step S204).

In the case of the interleave processing, the data required for transfer is stored only on the LSB side in 32 bits of the readout data. Thus, the readout side executes it with the data size of 32 bits by setting the immediate value (imm5) of the inter-register transfer command to 32, and the writing side executes 1-bit fixed size setting by using the w_mode, w_size registers of the writing data packing circuit 32 so that the packing processing is performed by 1 bit (step S205).

Through setting the data size and then repeating the inter-register transfer command between the memory controllers, the operation sequence as shown in FIG. 15 is performed. In the memory controllers 20 to 21, the writing data packing circuit 32 performs the packing processing while shifting the transfer data, and outputs the prescribed data when it becomes the unit of 32 bits to an intended memory in order via the writing data FIFO circuit 31 (step S206).

Through such functions of the memory controllers 20 to 21 (the address generators 30 and 40, the data FIFO circuits 31 and 41, and the data packing circuits 32 and 42), the coprocessor 11 of the exemplary embodiment can perform the interleave processing (de-interleave processing) with the processing throughput of 1 bit/cycle.

Particularly, it is the point for achieving the flexible and quick interleave processing that the use of the readout address generator 40 and the readout data FIFO circuit 31 makes it possible to read ahead the data on the memory in a pipeline manner without depending on the calculation processing of the control processor 10 and the coprocessor 11 and makes it possible to issue the addresses in the address order corresponding to the various kinds of interleave patterns.

(Processing Flow of First Exemplary Embodiment)

Figure 16A:
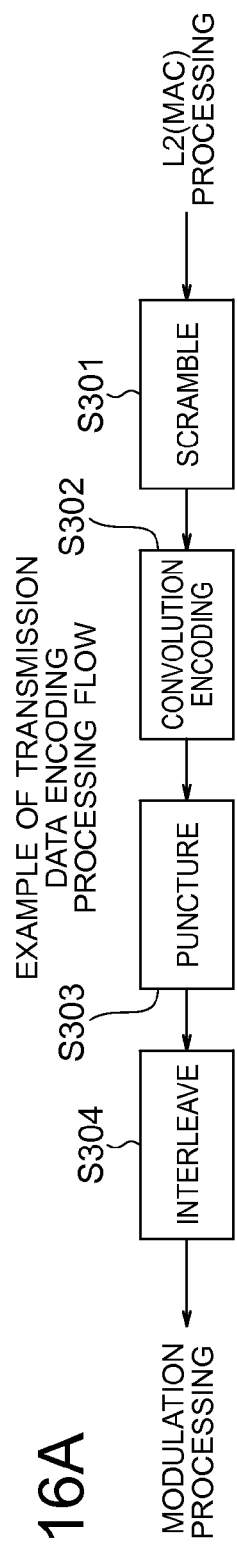
FIG. 16A is an explanatory chart showing an example of encoding processing executed in the encoding/decoding processor shown in FIG. 1 and FIG. 3.

FIG. 16A is an explanatory chart showing an example of the encoding processing in the encoding/decoding processor 100 shown in FIG. 1 and FIG. 3. As the encoding processing on the transmission side of the case of the example shown herein, the processing is performed in order of scrambling processing (step S301), convolution encoding processing (step S302), puncture processing (bit removal, step S303), and interleave processing (step S304) on the transmission data sequence transferred from a multi-purpose processor 201 that performs Layer2 (MAC) processing, and the encoded data sequence is transferred to a modem module 206 that performs modulation processing via the shared memory.

Figure 16B:
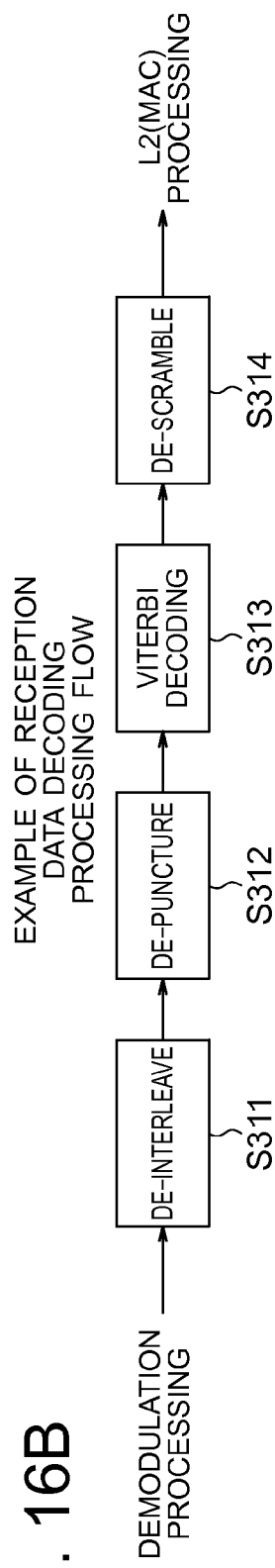
FIG. 16B is an explanatory chart showing an example of decoding processing executed in the encoding/decoding processor shown in FIG. 1 and FIG. 3.

FIG. 16B is an explanatory chart showing an example of the decoding processing in the encoding/decoding processor 100 shown in FIG. 1 and FIG. 3. As the decoding processing of the case of the example shown herein, the processing is performed in order of de-interleave processing (step S311), de-puncture processing (bit adding, step S312), Viterbi decoding (step S313), and de-scrambling (step S314) on the demodulated reception data sequence transferred from the modem module 206, and the decoded data sequence is transferred to the multi-purpose processor 201 that performs Layer2 (MAC) processing via the shared memory 203.

FIG. 17 is a sequence chart showing more details of the example of the processing sequence of the encoding processing shown in steps S310 to 304 when the processing shown in FIG. 16A is performed by the encoding/decoding processor 100 shown in FIG. 1 and FIG. 3.

When a processing start command is received from the multi-purpose processor (CPU) 201 or the resource manager 202 (step S401) in the case of the encoding processing performed on the transmission data sequence, the encoding/decoding processor 100 performs the scrambling processing by the exclusive unit (ALU) 22 while reading out the input data sequence from the shared memory 203 outside the encoding/decoding processing (codec) module by using the shared memory controller 21 (step S402), and stores the data to the data memory (local memory) 102 by using the local memory controller 20 (step S403).

The encoding/decoding processor 100 then performs the convolution encoding processing by the exclusive unit (ALU) 22 while reading out the data from the data memory (local memory) 102 by using the local memory controller 20 (step S404), and again stores the processing result data to the data memory (local memory) 102 (step S405).

In the same manner, the encoding/decoding processor 100 then performs the puncture processing by using the local memory controller 20 and the bit connection/rearrange command (PERM) (step S406), and again stores the processing result data to the data memory (local memory) 102 (step S407).

The encoding/decoding processor 100 then performs the interleave processing shown in FIG. 15 by reading out the data in order by using the local memory controller 20 (step S408), and stores the data sequence on which the interleave is performed to the shared memory 203 on the outside of the encoding/decoding (codec) module by using the shared memory controller 21 (step S409).

After completing the processing described above, the encoding/decoding processor 100 sends a processing completed notification to the multi-purpose processor (CPU) 201 or the resource manager 202 (step S410). The encoding/decoding processor 100 can achieve the encoding processing on the transmission data sequence by repeating the processing sequence described above.

FIG. 18 is a sequence chart showing more details of the example of the processing sequence of the decoding processing shown in steps S311 to 314 when the processing shown in FIG. 16B is performed by the encoding/decoding processor 100 shown in FIG. 1 and FIG. 3.

When a processing start command is received from the multi-purpose processor (CPU) 201 or the resource manager 202 (step S451) in the case of the decoding processing performed on the reception data sequence, the encoding/decoding processor 100 performs the de-interleave processing by reading out the input data sequence from the shared memory 203 outside the encoding/decoding (codec) module by using the shared memory controller 21 (step S452).

Note here that 1-bit data is stored as a soft value (a likelihood value) as 8-bit fixed decimal point data at the time of the decoding processing. Thus, an 8-bit mode is set to the address unit setting register (r_unit), and the data is transferred with the processing throughput of 8 bits/cycle (1 data/cycle). Then, the data on which the de-interleave processing is performed is stored to the data memory (local memory) 102 by using the local memory controller 20 (step S453).

The encoding/decoding processor 100 then performs the puncture (bit adding) processing by using the local memory controller 20 and the bit connection/rearrange command (PERM) (step S454). Then, the processed data is stored to the shared memory 105 inside the encoding/decoding (codec) module by using the shared memory controller 21 (step S455).

The encoding/decoding processor 100 then performs parameters such as the memory address, the generation polynomial, and the like for the Viterbi processing circuit 104, and starts the Viterbi processing circuit 104 for Viterbi decoding processing (step S456). The Viterbi processing circuit 104 performs the Viterbi decoding processing while reading out the data from the shared memory 105 inside the encoding/decoding (codec) module according to the set parameters (step S457), and stores the processed result data to the same shared memory 105 (step S458). It is informed to the encoding/decoding processor 100 that the Viterbi decoding processing is completed by a processing completion interruption (step S459).

At last, the encoding/decoding processor 100 performs the de-scrambling processing by the exclusive unit (ALU) 22 while reading out the data from the shared memory 105 inside the encoding/decoding (codec) module by using the shared memory controller 21 (step S460), and stores the data to the shared memory 203 outside the encoding/decoding (codec) module (step S461).

After completing the processing described above, the encoding/decoding processor 100 sends a processing completed notification to the multi-purpose processor (CPU) 201 or the resource manager 202 (step S462). The encoding/decoding processor 100 can achieve the decoding processing on the reception data sequence by repeating the processing sequence described above.

(Example of Mapping Structure of Exclusive Unit (ALU))

FIG. 19 is an explanatory chart showing an example of the mapping structure of a case where the convolution encoding processing and the scrambling (de-scrambling) processing of the encoding/decoding processor 100 shown in FIG. 1 and FIG. 3 are executed by mapping to the exclusive unit (ALU) 22 inside the coprocessor 11, i.e., an example of the setting of the parameter register 60.

In the example shown in FIG. 19, for the convolution encoding processing in IEEE 802.16e (WiMAX) standard, 0x2 (setting of encoding rate ½) is set as the operation mode (mode) and 0x6CE4 is set as the generation polynomial (poly) in order to operate the convolution encoder 51 shown in FIG. 7 as a convolution encoder 501 corresponding to that standard. Thereby, the convolution encoder 51 can be operated as the convolution encoder 501 that corresponds to IEEE 802.16e (WiMAX) standard.

Further, in order to operate the scrambling circuit 50 shown in FIG. 6 as a scrambling circuit 502 that can deal with the scrambling (de-scrambling) processing in IEEE 802.11a (wireless LAN) standard, 0x2 may be set as the operation mode (mode) and 0x1200 may be set as the generation polynomial (poly). Thereby, the scrambling circuit 50 operates as the scrambling circuit 502 that corresponds to IEEE 802.11a (wireless LAN) standard.

As described above, each calculator within the exclusive unit (ALU) 22 can deal with the encoding/decoding processing of already standardized various kinds of wireless systems by simply changing the parameter setting. Further, each calculator also has the flexibility that can sufficiently deal with the changes and the like in the specifications that may possibly occur in the future.

FIG. 20 is an explanatory chart showing a descriptive example of a processor processing program when the convolution processing and the scrambling (de-scrambling) processing of the encoding/decoding processor 100 shown in FIG. 1 and FIG. 3 is performed.

In the case of the scrambling processing shown in steps S301 and 401 of FIG. 17, first, setting of the readout address generator 40 to the shared memory controller 21 and setting of the writing address generator to the local memory controller 20 are performed by using a parameter register setting command (step S401a).

Note here that one address is the bit data of 32 bits. Thus, the value (num1) acquired by dividing the processing data bit size (num_bit_size) by 32 becomes the number of generating the addresses of the both. Note here that 0x218000 shows an example of the head address of the shared memory 203, and 0x118000 shows an example of the head address of the writing data memory (local memory) 102.

Then, as the setting of the parameter register 60 for the scrambling circuit 50 of the exclusive unit (ALU) 22, the operation mode setting, the TAP initial value setting, and the generation polynomial (poly) setting are performed (parameter register setting command, step S401b). Thereafter, in this example, the shared memory 21 and the local memory controller 20 whose parameter setting is done earlier are started (step S401c).

At last, the scrambling processing command (SCRAM) for 8 bits as the calculation command between the coprocessors is repeated four times, i.e., the scrambling processing (SCRAM) for 32 bits is repeated for the processed data bit size with for statement to achieve the intended scrambling processing (step S401d).

Note here that "scram (cr2, cr3, 8);" in step S401d means "cr2=scram (cr3, 8);". This shows an operation of performing the scrambling processing on the data (CR3 register value) from the shared memory controller 21 side and writing the data to the local memory controller 20 side via the CR2 register.

FIG. 20 shows an example of the scrambling (de-scrambling) processing. However, other processing such as the convolution encoding processing, the bit connection/rearrange processing, and the interleave processing can also be written as a program in a similar form.

(Second Exemplary Embodiment)

According to a second exemplary embodiment of the present invention, a wireless communication apparatus 301 includes an interleave processing circuit 404c that is exclusive hardware for performing interleave/de-interleave processing of transmission data and reception data in addition to the structure of the wireless communication apparatus 1 of the first exemplary embodiment. Further, an encoding/decoding processor 400 is designed to perform reception data error correction decoding and the processing other than the interleave/de-interleave processing of transmission data and reception data.

With this structure, it is also possible to acquire the same effects as those of the first exemplary embodiment and, further, to simplify the structure of the encoding/decoding processor 400. Hereinafter, this will be described in more details.

Figure 21:
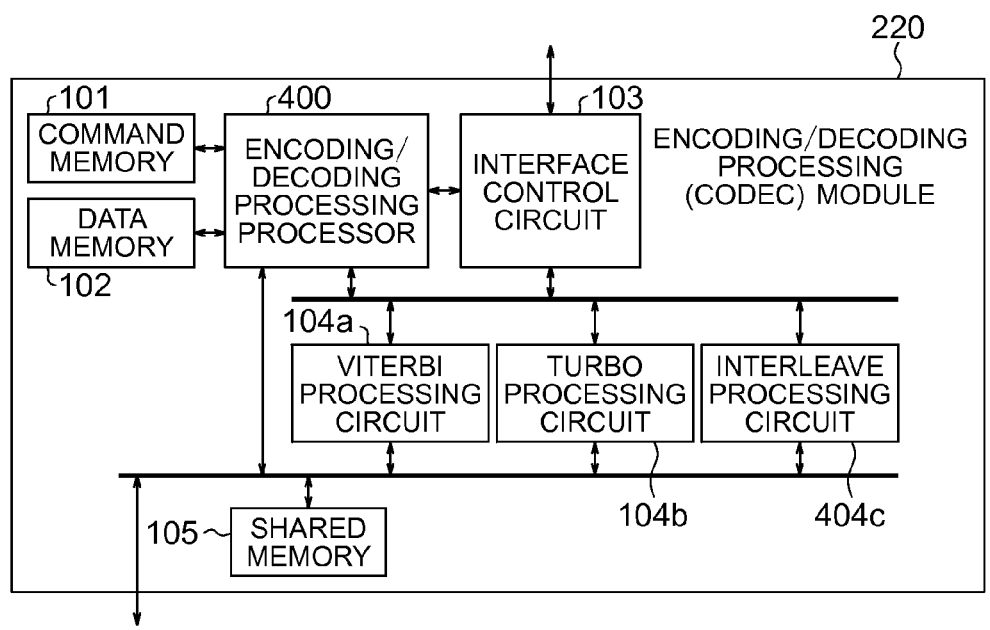
FIG. 21 is an explanatory chart showing a structure of a wireless communication apparatus that uses an encoding/decoding processor according to a second exemplary embodiment of the present invention.

FIG. 21 is an explanatory chart showing the structure of the wireless communication apparatus 301 that utilizes the encoding/decoding processor 400 according to the second exemplary embodiment of the present invention. The structure of the wireless communication apparatus 301 is same as that of the wireless communication apparatus 1 except that the encoding/decoding (codec) module 200 of the wireless communication apparatus 1 shown in FIG. 3 is replaced with another encoding/decoding (codec) module 220.

An encoding/decoding (codec) module 220 has the same structure as that of the encoding/decoding (codec) module 200 except for the points that the processor 100 of the encoding/decoding (codec) module 200 shown in FIG. 3 is replaced with another encoding/decoding processor 400 and that an interleave processing circuit 404c (DMA controller) is provided in parallel to the Viterbi processing circuit 104a and the turbo processing circuit 104b.

The interleave processing circuit 404c is a circuit for achieving the various kinds of interleave processing and the de-interleave processing (referred to as interleave/de-interleave processing hereinafter) of various kinds of wireless systems. That is, the encoding/decoding processor 400 performs the Viterbi decoding where processing amount is so great that the processing becomes insufficient with the processor processing, the turbo decoding, and the interleave/de-interleave processing where the parallel calculation is difficult among the encoding/decoding processing by using the Viterbi processing circuit 104a, the turbo processing circuit, and the interleave processing circuit 404c as the exclusive hardware, respectively.

The encoding/decoding processor 400 can perform the interleave processing in the encoding processing and the de-interleave processing in the decoding processing by using the exclusive interleave processing circuit (DMA controller).

As described, through performing exclusive hardware processing regarding the interleave/de-interleave processing where the parallel calculation for each bit is difficult and the processing throughput is 1 bit/cycle at the maximum, it is possible with the encoding/decoding processor 400 to execute the convolution encoding processing on the next data block simultaneously while performing the interleave processing for the previous data block, for example. Therefore, it is possible to increase the speed by the parallel processing and to improve the maximum processing throughput by dispersing the processing load.

Figure 22:
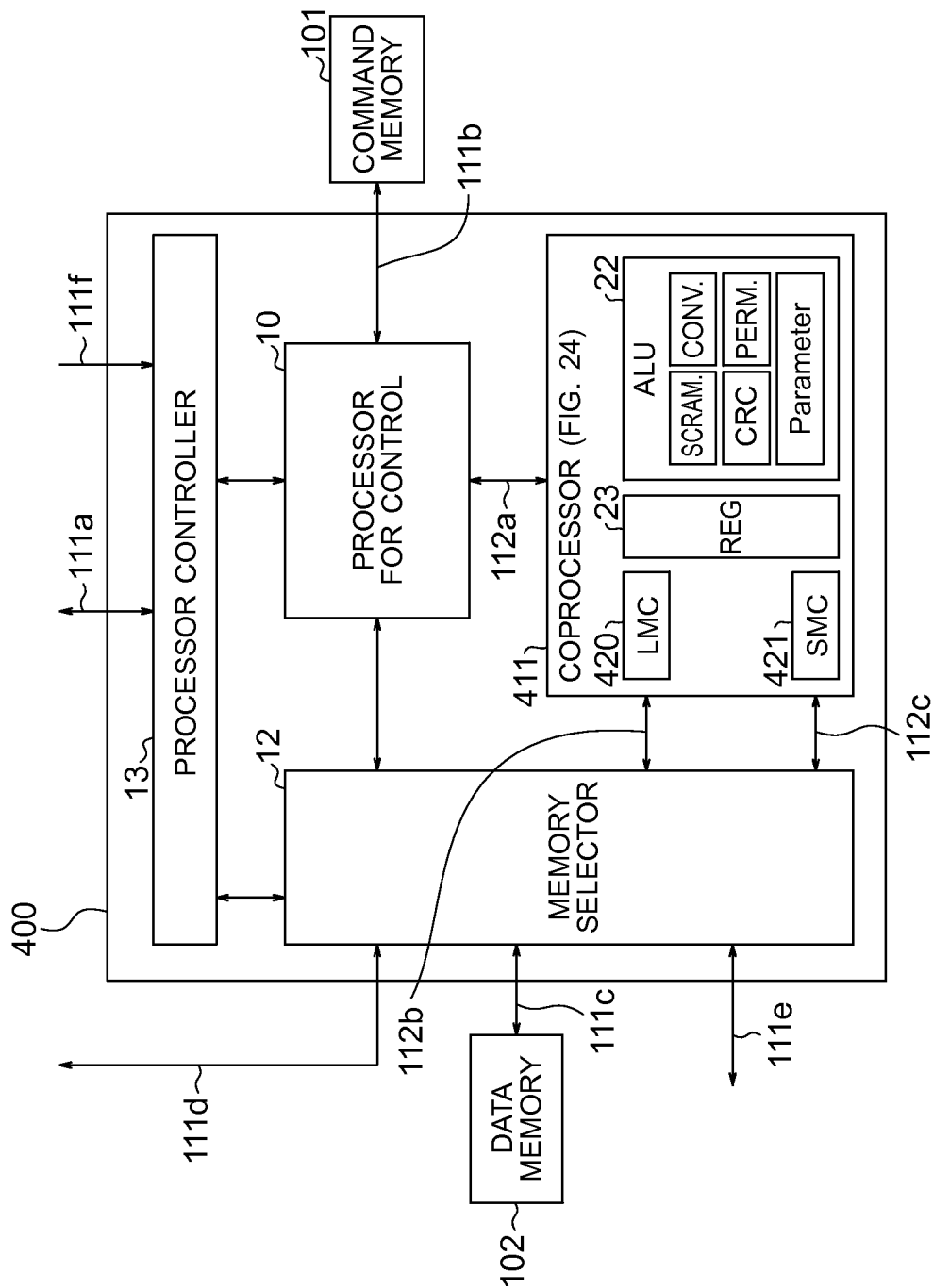
FIG. 22 is an explanatory chart showing a more detailed structure of the encoding/decoding processor shown in FIG. 21.

FIG. 22 is an explanatory chart showing a more detailed structure of the encoding/decoding processor 400 shown in FIG. 21. The encoding/decoding processor 400 has the same structure as that of the encoding/decoding processor 100 except that the coprocessor 11 of the encoding/decoding processor 100 shown in FIG. 1 is replaced with another coprocessor 411.

Figure 23:
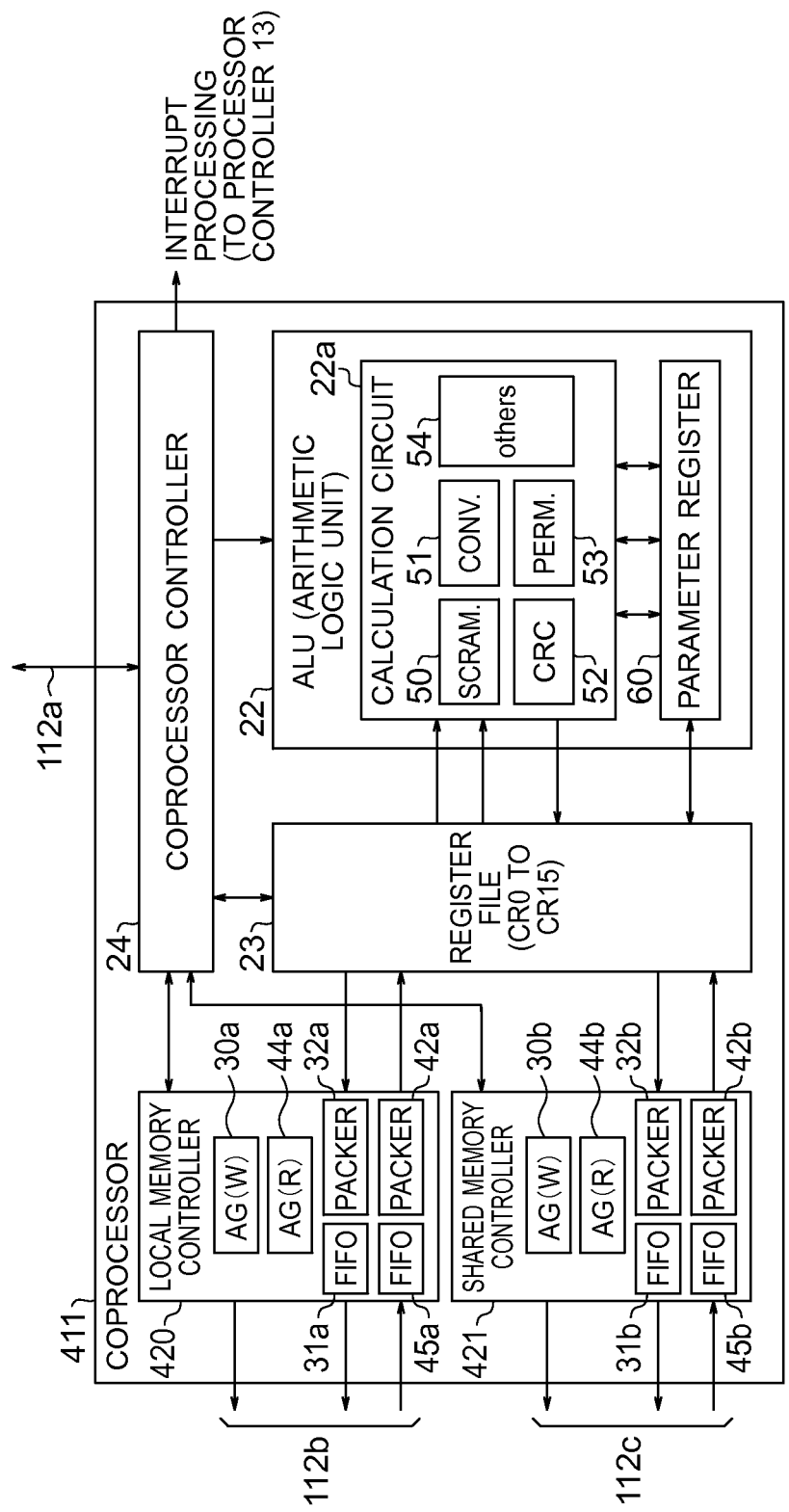
FIG. 23 is an explanatory chart showing a more detailed structure of a coprocessor shown in FIG. 22.

Further, FIG. 23 is an explanatory chart showing a more detailed structure of the coprocessor 411 shown in FIG. 22. The coprocessor 411 has the same structure as that of the coprocessor 11 except that the local memory controller (LMC) 20 and the shared memory controller (SMC) 21 of the coprocessor 11 are replaced with another local memory controller (LMC) 420 and another shared memory controller (SMC) 421, respectively.

Figure 24:
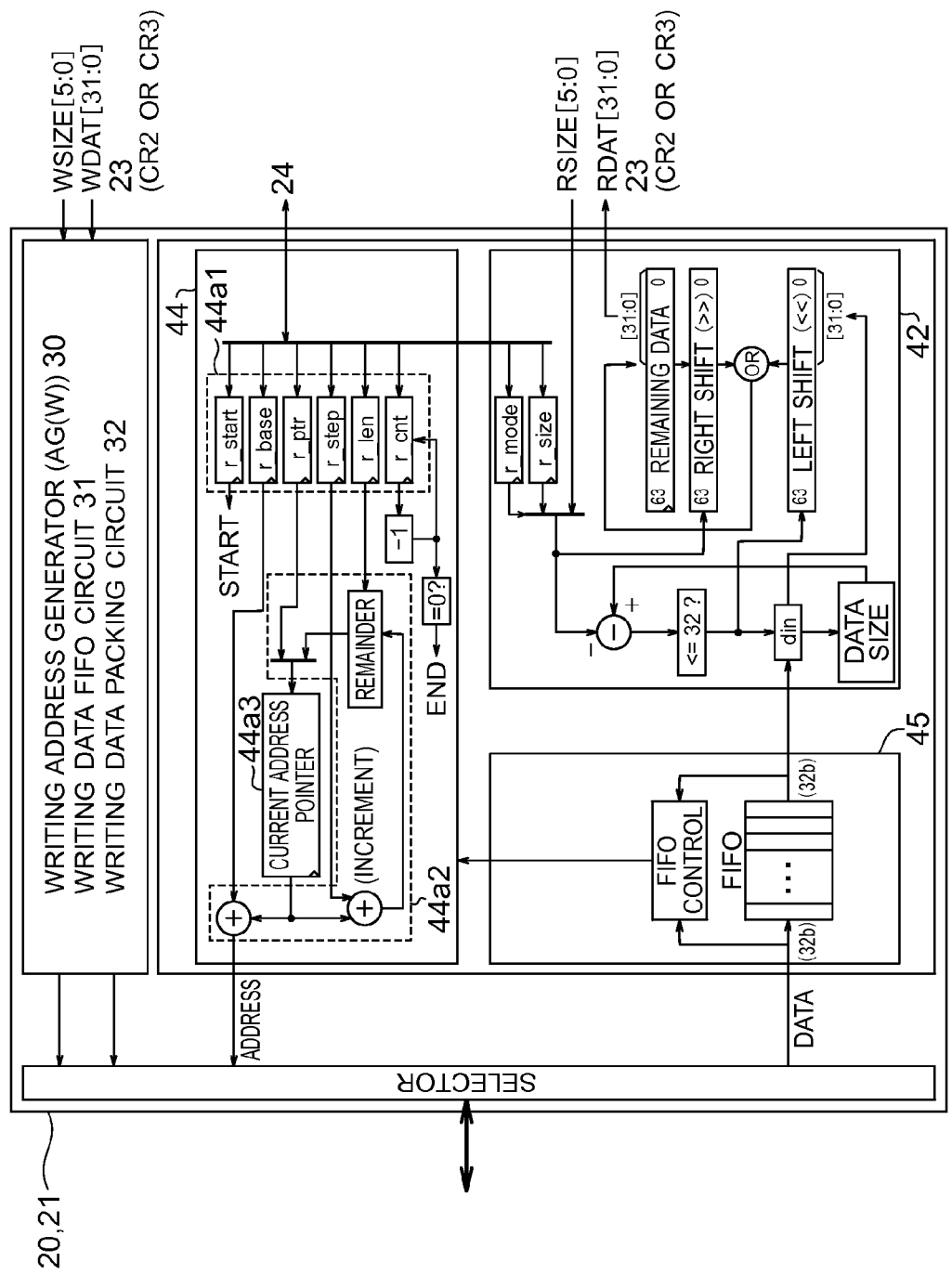
FIG. 24 is an explanatory chart showing more detailed structures of a local memory controller (LMC) and a shared memory controller (SMC) shown in FIG. 23.

FIG. 24 is an explanatory chart showing a more detailed structure of the local memory controller (LMC) 420 and the shared memory controller (SMC) 421 shown in FIG. 23. The local memory controller (LMC) 420 and the shared memory controller (SMC) 421 have the same structures as those of the first exemplary embodiment except that the readout address generator 40 and the readout data FIFO circuit 41 of the local memory controller (LMC) 20 and the shared memory controller (SMC) 21 according to the first exemplary embodiment are replaced with another readout address generator 44 and another readout data FIFO circuit 45, respectively.

In the encoding/decoding processor 100 according to the first exemplary embodiment, the readout address generator 40 provided inside each of the local memory controller (LMC) 20 and the shared memory controller (SMC) 21 includes two offset address calculation blocks having two address calculators provided inside thereof as well as the bit shift FIFO, the shift circuit, and the like for shifting the intended bit position in the 32-bit data to the LSB side in order to deal with the interleave/de-interleave processing of the various kinds of wireless communication systems with the processing throughput of 1 bit/cycle.

In the meantime, in the second exemplary embodiment, the interleave processing and the de-interleave processing are processed by the exclusive interleave processing circuit 404c. Thus, it is not necessary to perform the processing with the encoding/decoding processor 400. Therefore, in the local memory controller (LMC) 420 and the shared memory controller (SMC) 421, the structure of the readout address generator 44 on the readout side is different from that of the readout address generator 40 of the first exemplary embodiment. The structures and the operations of the writing address generator 30, the writing data FIFO circuit 31, and the writing data packing circuit 32 on the writing side are the same as those of the first exemplary embodiment.

The readout address generator 44 according to the second exemplary embodiment has almost the same structure as that of the writing address generator 30, which includes control registers 441a such as a start register (r_start), a base address register (r_base), an initial pointer register (rptr), a step register (r_step), a memory length register (r_len), and an access time register (r_cnt). Further, also provided for actually calculating the address are address calculators 44a2 including a current address pointer register 44a3, adders (two), remainder calculators (comparator and subtractor), a comparator as well as a subtractor for counting the number of accesses, etc.

When values are set to the control registers 44a1 such as the base address register (r_base), the initial pointer register (rptr), the step register (r_step), the memory length register (r_len), and the access time register (r_cnt) by the parameter setting command of the coprocessor and are started by setting the start register (r_start), the readout address generator 44 according to the second exemplary embodiment independently generates the readout addresses for the memory and continuously issues those for the value of the access time register (r_cnt).

Through speculatively issuing the readout address, the readout address generator 44 deals with the split transaction at the time of reading. Basically, the address acquired by adding the current address pointer value to the base address (r_base) is issued.

The value of the current address pointer register 44a3 is updated every time an address is outputted by taking the value of the initial pointer (rptr) as the initial value. The address calculator 44a2 adds the step number (r_step) to the current address with a 32-bit address unit every time an address is outputted and performs a remainder (Modulo) calculation thereon with the memory length size (r_len) to take it as the next current address pointer.

With such structures, it is possible to generate flexible readout address patterns, e.g., reading at continuous addresses in an ascending order or a descending order, reading at arbitrary address intervals through controlling the step number (r_step), and reading started from the middle of the memory to the last and then returned to the head to start reading through controlling the memory length (r_len) for an arbitrary memory region.

However, it is not possible to generate a two-dimensional address pattern which achieves the interleave/de-interleave processing shown in the first exemplary embodiment with the processing throughput of 1 bit/cycle (the interleave processing circuit 404c is provided additionally, so that it is not necessary).

Then, the processing on the readout data side read out from the memory will be described. The data (RDAT) read out from the memory is transferred to the exclusive unit (ALU) 22 side via the readout data FIFO circuit 45 and the readout data packing circuit 42. The data (RDAT) read out from the memory is stored to the readout data FIFO circuit 45 in order, and transferred to the readout data packing circuit 42 in order.

In the second exemplary embodiment, the address generation unit in the readout address generator 44 is 32-bit unit that is same as the memory address. Thus, the bit shift processing for shifting an intended bit to the LSB side is not performed.

As in the case of the first exemplary embodiment, when the data is read out from the exclusive unit (ALU) 22 side by using the CR2 or CR3 register, the readout data packing circuit 42 right-shifts the data (remaining data register) remained within the readout data packing circuit currently according to the value of the designated readout data size (RSIZE). When the effective bit number of the remaining data is 32 bits or more, the readout data from the readout data FIFO circuit 45 side is not acquired.

In the meantime, when the effective bit number of the remaining data is less than 32 bits, the readout data packing circuit 42 acquires the next readout data from the readout data FIFO circuit 45 side. The acquired readout data is left-shifted for the size of the remaining data and combined to the MSB side of the remaining data. The combined data is stored to the data register (remaining data register) so that it can be read out from the exclusive unit (ALU) 22 side next.

Through providing such readout data packing circuit 42, the shift processing and the packing processing of the data can be executed automatically (the shift calculation processing on the processor side is unnecessary). Thus, it is possible to perform the stream data processing without having overhead in the processing cycle number even when the data processing unit (input data size) on the exclusive unit (ALU) 22 side is other than 32 bits.

In a case of a command (PERM command or the like) where an intended processing data size (RSIZE) cannot be outputted from the exclusive unit (ALU) 22 side, it is also possible to set the fixed size by using the fixed size setting register (r_mode, r_size).

(Effects Achieved by First and Second Exemplary Embodiments)

Each of the effects acquired by the encoding/decoding processors 100 and 400 according to the above-described first and second exemplary embodiments will be described.

The first effect is that it is possible to flexibly deal with the various kinds of encoding/decoding processing of a plurality of wireless communication systems with the encoding/decoding processing module. The reason is that the encoding/decoding processors 100 and 400 according to the present invention are so structured that: the coprocessor 11 or 411 exclusively used for the encoding/decoding processing (bit/byte calculation processing) is connected to a typical control processor; and the unit (ALU) 22 of the coprocessor 11 includes the scrambling circuit 50, the convolution encoder 51, the CRC encoder 52, the bit connection (rearrange) circuit 53, and the like capable of setting the parameters of the processing of the operation modes (programmable) and the like and capable of processing a plurality of bits in parallel in 1 cycle.

As described above, the encoding/decoding processors 100 and 400 can flexibly and quickly deal with the various kinds of encoding/decoding processing (bit/byte calculation processing) of a plurality of wireless communication systems through achieving the various kinds of encoding/decoding processing calculators capable of setting the parameters as the coprocessor of the control processing that is originally capable of flexibly performing the processing.

Further, for making it possible to improve the flexibility of the encoding/decoding processors 100 and 400 for dealing with the various kinds of encoding/decoding processing, it is also one of the reasons that: the coprocessor 11 has the built-in memory controllers 20 to 21 for making an access to the memory; and each of the memory controllers includes each of the FIFO circuits 31 and 41 for separating the coprocessor calculation command for performing the encoding/decoding processing and the cycle for actually making an access to the memory, and the data packing circuits 32 and 42 for performing the packing processing of the readout data and the writing data according to the processing bit number of the unit (ALU) 22 of the coprocessor 11.

That is, the encoding/decoding processors 100 and 400 are capable of designating the processing bit number in the unit (ALU) 22 by a calculation command of the coprocessor used exclusively for the encoding/decoding processing, and capable of absorbing the change in the processing bit number by the data packing circuits 32 and 42 at the time of reading and writing the data without having cycle overhead. Thus, it is possible to flexibly deal with the encoding/decoding processing (bit/byte calculation processing) of various wireless systems.

Further, there is also an advantage that it is possible to flexibly deal with the various kinds of interleave processing (de-interleave processing) of the various kinds of wireless systems with the processing throughput of 1 bit/cycle through using the readout address generator 40 within the memory controllers 20 to 21 of the first exemplary embodiment.

This advantage is generated because it becomes possible to flexibly deal with a two-dimensional interleave address pattern including various kinds of block interleave processing by performing control register setting once through employing the structure in which the readout address generator 40 includes two offset address calculation blocks having two built-in address calculators, and the output address of the both are added and outputted.

Further, through providing the mode setting register capable of changing the address unit to 1 bit, 8 bits, 32 bits, and the like within the readout address generator 40, it is possible to achieve an advantage of being able to deal with the interleave processing of 1 bit/data on the transmission side, the de-interleave processing of 8 bits/data on the reception side, and the like.

The second effect is that it is possible to quickly achieve the encoding/decoding processing including the memory access latency such as simultaneously calculating a plurality of bits (bytes) when it is structured to achieve the encoding and decoding processing with software processing by the encoding/decoding processors 100 and 400 by placing the importance on the flexibility in the encoding/decoding module 200 of the wireless communication apparatus 1.

The reason thereof is that in the encoding/decoding processors 100 and 400, the coprocessor 11 used exclusively for the encoding/decoding processing (bit/byte calculation processing) is connected to a typical control processor, and the memory controllers 20 to 21 having the address generation function capable of hiding the memory access latency, the FIFO function, and the data packing function built inside thereof are provided for the access from the coprocessor to the memory.

The use of such memory controllers 20 to 21 makes it possible to perform the encoding/decoding processing (bit/byte calculation processing) by the coprocessor command and the memory access in parallel independently. Therefore, it is possible to hide the memory access latency and perform the processing at a higher speed compared to that of the typical processor processing.

Further, to have the scrambling circuit 50, the convolution encoder 51, the CRC encoder 52, the bit connection (rearrange) circuit 53, and the like capable of setting the parameters such as the operation mode (programmable) and capable of processing a plurality of bits in parallel in 1 cycle as the unit (ALU) 22 within the coprocessor 11 is also one of the reasons for making it possible to increase the speed.

With the software processing by using a typical processor, about 10 cycles are required for the scrambling processing, the convolution processing, and the CRC encoding processing of 1 bit, respectively. Further, the number of processing cycles in the order of about 80 cycles is required for processing 8 bits.

In the meantime, through the use of the coprocessor processing command utilizing the coprocessor logic unit (ALU) 22 and the memory controllers 20 to 21, it is possible with the encoding/decoding processors 100 and 400 to achieve the encoding/decoding processing such as the scrambling processing (de-scrambling processing), the convolution encoding processing, the CRC encoding processing (CRC judgment processing), and the like with the processing throughput of 8 bits/cycle, for example.

Further, through providing the readout address generator 40 and the data packing circuit (PACKER) 42 within the memory controllers 20 to 21 according to the first exemplary embodiment, there is an advantage of being able to achieve the interleave processing (de-interleave processing) of various kinds of wireless systems with the processing throughput of 1 bit/cycle.

With the typical processor processing, about 10 cycles for the processing cycles are required for calculating the interleave address of 1 bit and the number of processing cycles for the memory access latency are required also for the data copy processing between the memories. Therefore, it is a great advantage of the exemplary embodiment to be able to achieve various kinds of interleave processing with 1 bit/cycle.

The maximum effect of the exemplary embodiment is that it is possible to simultaneously achieve the two advantages of the first effect that is the flexibility for dealing with a plurality of wireless systems and the second effect that is the high speed for achieving the encoding/decoding processing with the processing throughput of 8 bits/cycle or 1 bit/cycle.

The reason thereof is the combined effect of the following three achieved points. The first point is that the flexibility and quickness of the encoding/decoding processing itself are achieved through providing a plurality of encoding/decoding processing circuits such as the convolution encoder capable of setting the parameter and capable of performing the processing of a plurality of bits in 1 cycle as the unit (ALU) 22 of the coprocessor.

The second point is that the memory controllers 20 to 21 for making a stream access operating in parallel independently from the coprocessor calculation processing are provided, so that the memory access latency of the processor with which it is typically difficult to increase the speed can be hidden.

The third point is that the data packing circuits 32 and 42 for shifting and packing the data according to the data bus width on the memory side and the processing bit number of each command on the exclusive ALU (unit) side, the FIFO 31 and 41 for temporarily storing the data, and the waiting control mechanism with which the processing on the coprocessor side does not fail even when the FIFO becomes empty or full are provided for not having the processing overhead between the unit (ALU) 22 and the memory controllers 20 to 21 operating in parallel. With the combined effects of the three points described above, the encoding/decoding processors 100 and 400 can achieve both the flexibility and the quickness.

The third effect is that it is possible to achieve the various kinds of encoding/decoding processing of a plurality of wireless systems with still lower power consumption, i.e., high power efficiency.

The reason thereof is as follows. In the encoding/decoding processors 100 and 400, each of the calculation circuits provided to the unit (ALU) 22 within the coprocessor 11 such as the scrambling circuit 50, the convolution encoder 51, the CRC encoder 52, the bit connection (rearrange) circuit 53, and the like are achieved with the structures that are almost similar to the exclusive hardware as the circuit structure even though each of those is capable of setting the parameters of the operation modes (programmable) and capable of processing a plurality of bits in parallel in 1 cycle.

That is, those calculation circuits are the exclusive calculator structure capable of achieving the processing throughput of 8 bits/cycle or 1 bit/cycle, for example, while being structured to have the flexibility of some extent capable of dealing with a plurality of wireless system. This makes it possible to achieve the encoding/decoding module having an excellent balance between the processing performance and the power consumption and exhibiting high power efficiency.

In the case of the exclusive hardware structure, a control circuit for counting the repeated time of the respective processing data is required. However, in the encoding/decoding processors 100 and 400, a loop circuit for a loop command originally mounted to the control processor side is used for the repetition processing of for statement and the like. Thus, the repetition control circuit is unnecessary on the coprocessor side (can be shared for a regular command and a plurality of encoding/decoding processing commands).

Further, it is also the advantage of the present invention to be able to improve the power efficiency because the entire system structure can be selected depending on the tradeoff, e.g., processing amount is so great that the Viterbi decoding processing and the turbo decoding processing whose power efficiency becomes high with the exclusive hardware are achieved by the Viterbi processing circuit 104a and the turbo processing circuit 104b as the exclusive hardware, respectively, and other encoding/decoding processing is achieved by the encoding/decoding processor by placing the importance on the flexibility.

For example, in the encoding/decoding processor 400 shown as the second exemplary embodiment, the power efficiency is improved further by using the interleave processing circuit 404c as the exclusive hardware circuit for achieving the interleave processing and the de-interleave processing with which the processing amount may become insufficient when the processing thereof is performed by using the same processor as that of other encoding/decoding processing.

That is, regarding the memory controllers 420 to 421 within the encoding/decoding processor 400, the circuit scale can be reduced compared to that of the encoding/decoding processor 100 according to the first exemplary embodiment through achieving the writing address generator 30 and the readout address generator 44 with almost the same structures as shown in the second exemplary embodiment. Further, there is an advantage of being able to achieve the operations with a low clock frequency, since the encoding/decoding processor 400 and the interleave processing circuit 404c can be operated in parallel.

At last, the fourth effect is that it is possible to flexibly deal with the specification changes and specification expansions that may occur in the future in the various kinds of encoding/decoding processing of a plurality of wireless systems.

The reason thereof is that it becomes possible to designate the processing (command) with software with a unit of 1 cycle since the encoding/decoding processors 100 and 400 are not achieved by a combination of the control processor and the exclusive hardware circuit but achieved by connecting the coprocessor 11 used exclusively for the encoding/decoding processing (bit/byte calculation processing) to the typical control processor 10.

That is, there is an advantage that it is possible with the changes in the software description of the processor to flexibly deal with the case where the processing order or the processing parameter is changed due to the specification changes in the encoding/decoding processing of the existing wireless systems, with the case where the processing is added by specification changes, and the like.

Each of the calculator sections of the encoding/decoding processing (bit/byte processing) within the coprocessor 11 is an exclusive circuit capable of setting the parameter. However, the processing data unit, the loop number, and the like in a series of encoding/decoding processing are dealt with the loop commands (loop circuits) within the control processor 10. Thus, changes in the processing data unit, the loop number, and the like can be sufficiently dealt with the original functions of the control processor 10.

While the present invention has been described above by referring to the specific embodiments shown in the drawings, the present invention is not limited only to the embodiments described above. Any other known structures can be employed, as long as the effects of the present invention can be achieved therewith.

Regarding each of the embodiments described above, the new technical contents of the above-described embodiments can be summarized as follows. While a part of or a whole part of the embodiments can be summarized as follows as the new techniques, the present invention is not necessarily limited only to the followings.

(Supplementary Note 1)

An encoding/decoding processor built-in within a wireless communication apparatus for performing encoding and decoding processing of communication data, which includes a coprocessor used exclusively for the encoding and decoding processing, wherein the coprocessor includes:

a parameter register which stores setting regarding an operation mode and a generation polynomial given from outside; and a calculation circuit which is operated based on the operation mode and the generation polynomial, and performs a calculation required for the encoding and decoding processing of a plurality of bits in 1 cycle.

(Supplementary Note 2)

The encoding/decoding processor as depicted in Supplementary Note 1, wherein:

the coprocessor includes a memory controller for making an access to a storage device that is built in or connected outside; and the memory controller includes an address generator circuit which performs an operation for outputting an address on the storage device where data is read out and written independently according to a parameter given from outside, a FIFO (First In First Out) circuit which temporarily stores data written to the outputted address on the storage device or data read from the address, and a data packing circuit which outputs the data written to the outputted address on the storage device or the data read from the address by aligning number of bits thereof to number of bits defined in advance.

(Supplementary Note 3)

The encoding/decoding processor as depicted in Supplementary Note 2, wherein the memory controller includes the address generator circuit, the FIFO circuit, and the data packing circuit for reading out data and for writing data, respectively.

(Supplementary Note 4)

The encoding/decoding processor as depicted in Supplementary Note 3, wherein the data writing address generator circuit includes:

a control register which stores an initial pointer, a step number, and a memory length, respectively; and an address calculator which outputs, as a next address pointer, a result acquired by performing a remainder calculation on a value acquired by adding the step number every time an address is issued with a value of the memory length by taking a value of the initial pointer as an initial value.

(Supplementary Note 5)

The encoding/decoding processor as depicted in Supplementary Note 3, wherein:

the data readout address generator circuit includes a plurality of offset address calculation modules, and an adder which adds issued addresses from the offset address calculation modules to acquire an actual offset address; and the offset address calculation module includes a first and a second address calculators, wherein an address pointer of the first address calculator is updated to a value of an address pointer calculated by the second address calculator with a value of counted number given from outside for every specific number of times.

(Supplementary Note 6)

The encoding/decoding processor as depicted in Supplementary Note 5, wherein the data readout address generator circuit includes:

a shift circuit which shifts the issued offset address in a memory address unit according to address unit setting given from outside; and a bit shift data FIFO circuit which acquires an intended bit position from the data read out from the memory.

(Supplementary Note 7)

The encoding/decoding processor as depicted in Supplementary Note 2, wherein the memory controller includes:

a regular access function which reads out data stored at a designated register access number on the storage device from the calculation circuit side, and updates a stored content of the register access number; and a peep function which reads out the data stored at the designated register access number on the storage device without update from the calculation circuit side.

(Supplementary Note 8)

The encoding/decoding processor as depicted in Supplementary Note 1, wherein:

the calculation circuit includes a function which performs one or more kinds of processing out of scrambling processing, convolution encoding processing, CRC encoding processing, and bit connection/rearrange processing according to the operation mode and the generation polynomial given from outside.

(Supplementary Note 9)

A wireless communication apparatus which includes an encoding/decoding (codec) module which performs encoding processing on transmission data transmitted to outside and decoding processing on reception data received from outside, wherein the encoding/decoding (codec) module includes:
one or more circuits of a Viterbi processing circuit and a turbo processing circuit as exclusive hardware for performing Viterbi decoding and turbo decoding of the reception data; and
the encoding/decoding processor as depicted in any one of Supplementary Notes 1 to 8 for performing processing other than the Viterbi decoding and the turbo decoding of the reception data.

(Supplementary Note 10)

The wireless communication apparatus as depicted in Supplementary Note 9, wherein the encoding/decoding (codec) module includes:
an interleave processing circuit that is exclusive hardware for performing interleave/de-interleave processing of the transmission data and the reception data; and
the encoding/decoding processor performs processing other than the Viterbi decoding and the turbo decoding of the reception data, and the interleave/de-interleave processing of the transmission data and the reception data.

This application claims the Priority right based on Japanese Patent Application No. 2011-026885 filed on Feb. 10, 2011 and the disclosure thereof is hereby incorporated by reference in its entirety.

Industrial Applicability

It is possible to be broadly utilized for wireless communication apparatuses. Specifically, it is suited for a wireless communication apparatus that can deal with a plurality of wireless systems by the single apparatus. Further, it is also effective for reducing the size and weight as well as the cost of such wireless communication apparatus and for increasing the speed of the communication.

REFERENCE NUMERALS 1, 301 Wireless communication apparatus
10 Processor for control
11, 411 Coprocessor
12 Memory selector
13 Processor controller
20, 420 Local memory controller
21, 421 Shared memory controller
22 Arithmetic Logic Unit (ALU)
22a Calculation circuit
23 Register file
24 Coprocessor controller
30, 30a, 30b Writing address generator
30a1, 40a1, 44a1 Control register
30a2, 44a2 Address calculator
30a3, 44a3 Current address pointer register
31, 31a, 31b Writing data FIFO circuit
32, 32a, 32b Writing data packing circuit
40, 40a, 40b, 44 Readout address generator
40a2 Shift circuit
40a3 Bit shift FIFO
40a4 Adder
41, 41a, 41b, 45 Readout data FIFO circuit
42, 42a, 42b Readout data packing circuit
50, 502 Scrambling circuit (SCRAM)
51, 501 Convolution encoder (CONV)
52 CRC encoder (CRC)
53 Bit connection/rearrange circuit (PERM)
54 Other calculation circuits
60 Parameter register
70 Scrambling calculator
71 Convolution encoding calculator
72 CRC encoding calculator (CRC)
80 Offset address generator
81, 82, 83, 84 Address calculator
81a, 82a, 83a, 84a Address pointer
100, 400 Encoding/decoding processor
101 Command memory
102 Data memory
103 Interface control circuit
104a Viterbi processing circuit
104b Turbo processing circuit
105, 203 Shared memory
111a Processor control interface
111b Command memory interface
111c, 112b Local memory interface
111d DSP interface
111e, 112c Shared memory interface
111f Interruption interface
112a Coprocessor interface
200, 220 Encoding/decoding (codec) module
201 Multi-purpose processor
202 Resource manager
204 RF interface
205 Search module
206 Modem module
404c Interleave processing circuit

What is claimed is:

1. An encoding/decoding processor built-in within a wireless communication apparatus for performing encoding and decoding processing of communication data, comprising a coprocessor used exclusively for the encoding and decoding processing, wherein the coprocessor comprises:
a parameter register which stores setting regarding an operation mode and a generation polynomial given from outside;
a memory controller for making an access to a storage device that is built in or connected outside; and
a calculation circuit which is operated based on the operation mode and the generation polynomial, and performs a calculation required for the encoding and decoding processing of a plurality of bits in 1 cycle, wherein
the memory controller comprises:
an address generator circuit which performs an operation for outputting an address on the storage device where data is read out and written independently according to a parameter given from outside;
a FIFO (First In First Out) circuit which temporarily stores data written to the outputted address on the storage device or data read from the address; and
a data packing circuit which outputs the data written to the outputted address on the storage device or the data read from the address by aligning number of bits thereof to number of bits defined in advance.

2. The encoding/decoding processor as claimed in claim 1, wherein the address generator circuit comprises a data writing address generator circuit and the data writing address generator circuit comprises:
a control register which stores an initial pointer, a step number, and a memory length, respectively; and
an address calculator which outputs, as a next address pointer, a result acquired by performing a remainder calculation on a value acquired by adding the step number every time an address is issued with a value of the memory length by taking a value of the initial pointer as an initial value.

3. The encoding/decoding processor as in claimed in claim 1, wherein the address generator circuit comprises a data readout address generator circuit and the data readout address generator circuit comprises:

a plurality of offset address calculation modules, and an adder which adds issued addresses from the offset address calculation modules to acquire an actual offset address; and the offset address calculation module comprises a first and a second address calculators, wherein an address pointer of the first address calculator is updated to a value of an address pointer calculated by the second address calculator with a value of counted number given from outside for every specific number of times.

4. The encoding/decoding processor as claimed in claim 3, wherein the data readout address generator circuit comprises:

a shift circuit which shifts the issued offset address in a memory address unit according to address unit setting given from outside; and a bit shift data FIFO circuit which acquires an intended bit position from the data read out from the memory.

5. The encoding/decoding processor as claimed in claim 1, wherein the memory controller comprises:

a regular access function which reads out data stored at a designated register access number on the storage device from the calculation circuit side, and updates a stored content of the register access number; and a peep function which reads out the data stored at the designated register access number on the storage device without update from the calculation circuit side.

6. The encoding/decoding processor as claimed in claim 1, wherein:

the calculation circuit comprises a function which performs one or more kinds of processing out of scrambling processing, convolution encoding processing, CRC encoding processing, and bit connection/rearrange processing according to the operation mode and the generation polynomial given from outside.

7. A wireless communication apparatus, comprising an encoding/decoding (codec) module which performs encoding processing on transmission data transmitted to outside and decoding processing on reception data received from outside, wherein the encoding/decoding (codec) module comprises:

an error correction decoding processing circuit that is exclusive hardware for performing error correction decoding of the reception data; and the encoding/decoding processor as claimed in claim 1 for performing processing other than the error correction decoding of the reception data.

8. The wireless communication apparatus as claimed in claim 7, wherein the encoding/decoding (codec) module comprises:

an interleave processing circuit that is exclusive hardware for performing interleave/de-interleave processing of the transmission data and the reception data; and the encoding/decoding processor performs processing other than the error correction decoding of the reception data, and the interleave/de-interleave processing of the transmission data and the reception data.

9. An encoding/decoding processor built-in within a wireless communication apparatus for performing encoding and decoding processing of communication data, comprising a coprocessor used exclusively for the encoding and decoding processing, wherein the coprocessor comprises:

parameter register means for storing setting regarding an operation mode and a generation polynomial given from outside;

memory controller means for making an access to a storage device that is built in or connected outside; and calculation means which is operated based on the operation mode and the generation polynomial, for performing a calculation required for the encoding and decoding processing of a plurality of bits in 1 cycle, wherein the memory controller means comprises:

address generator means which performs an operation for outputting an address on the storage device where data is read out and written independently according to a parameter given from outside;

FIFO (First In First Out) means which temporarily stores data written to the outputted address on the storage device or data read from the address; and data packing means which outputs the data written to the outputted address on the storage device or the data read from the address by aligning number of bits thereof to number of bits defined in advance.

* * * * *